(12) United States Patent
Okamoto

(10) Patent No.: US 10,431,164 B2
(45) Date of Patent: Oct. 1, 2019

(54) DISPLAY DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventor: Yuki Okamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/621,001

(22) Filed: Jun. 13, 2017

(65) Prior Publication Data

US 2017/0365224 A1 Dec. 21, 2017

(30) Foreign Application Priority Data

Jun. 16, 2016 (JP) .................................. 2016-119831

(51) Int. Cl.
*G09G 3/34* (2006.01)
*G02F 1/13* (2006.01)
(Continued)

(52) U.S. Cl.
CPC ............. *G09G 3/3406* (2013.01); *G02F 1/13* (2013.01); *G09G 3/2011* (2013.01);
(Continued)

(58) Field of Classification Search
CPC .. G09G 3/3406; G09G 3/2011; G09G 3/3225; G09G 3/3426; G09G 3/346;
(Continued)

(56) References Cited

U.S. PATENT DOCUMENTS 6,265,833 B1 7/2001 Kim et al.
6,337,675 B1 1/2002 Toffolo et al.
(Continued)

FOREIGN PATENT DOCUMENTS

JP 2001-066593 A 3/2001
JP 2002-196702 A 7/2002
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Tom V Sheng
(74) *Attorney, Agent, or Firm* — Fish & Richardson P.C.

(57) ABSTRACT

A display device with low power consumption is provided. A display device having high visibility regardless of the ambient brightness is provided. The display device includes a light-receiving element, a display element, a first transistor, and a second transistor. One of a source and a drain of the first transistor is electrically connected to one electrode of the light-receiving element. The one of the source and the drain of the first transistor is electrically connected to one of a source and a drain of the second transistor. The display device has a function of, by turning on the second transistor, changing the gray level of the display element in accordance with the amount of light detected by the light-receiving element.

14 Claims, 25 Drawing Sheets

(51) Int. Cl.
| | | |
|---|---|---|
| *G09G 3/20* | (2006.01) | |
| *G09G 3/3225* | (2016.01) | |
| *G09G 3/36* | (2006.01) | |
| *H01L 29/786* | (2006.01) | |
| *G02F 1/1362* | (2006.01) | |
| *G11C 19/28* | (2006.01) | |

(52) U.S. Cl.
CPC ........... *G09G 3/3225* (2013.01); *G09G 3/346* (2013.01); *G09G 3/3426* (2013.01); *G09G 3/3648* (2013.01); *H01L 29/786* (2013.01); *G02F 1/1362* (2013.01); *G02F 2203/30* (2013.01); *G09G 2300/0456* (2013.01); *G09G 2300/08* (2013.01); *G09G 2300/0804* (2013.01); *G09G 2310/0286* (2013.01); *G09G 2310/08* (2013.01); *G09G 2320/0209* (2013.01); *G09G 2320/0233* (2013.01); *G09G 2320/0242* (2013.01); *G09G 2320/0633* (2013.01); *G09G 2320/0686* (2013.01); *G09G 2330/023* (2013.01); *G09G 2360/144* (2013.01); *G09G 2360/148* (2013.01); *G11C 19/28* (2013.01)

(58) Field of Classification Search
CPC ......... G09G 3/3648; G09G 2300/0456; G09G 2300/08; G09G 2300/0804; G09G 2300/0809; G09G 2300/0819; G09G 2310/0286; G09G 2310/08; G09G 2320/0209; G09G 2320/0233; G09G 2320/0242; G09G 2320/0633; G09G 2320/0686; G09G 2330/023; G09G 2360/142; G09G 2360/144; G09G 2360/148; H01L 29/786; H01L 27/3269; G02F 1/13; G02F 1/1362; G02F 2203/30; G11C 19/28
See application file for complete search history.

(56) References Cited

U.S. PATENT DOCUMENTS

| | | | |
|---|---|---|---|
| 6,424,326 | B2 | 7/2002 | Yamazaki et al. |
| 6,614,076 | B2 | 9/2003 | Kawasaki et al. |
| 6,714,268 | B2 | 3/2004 | Wang et al. |
| 6,828,951 | B2 | 12/2004 | Yamazaki et al. |
| 7,038,641 | B2 | 5/2006 | Hirota et al. |
| 7,084,936 | B2 | 8/2006 | Kato |
| 7,102,704 | B2 | 9/2006 | Mitsui et al. |
| 7,173,279 | B2 | 2/2007 | Yamazaki et al. |
| 7,176,991 | B2 | 2/2007 | Mitsui et al. |
| 7,239,361 | B2 | 7/2007 | Kato |
| 7,248,235 | B2 | 7/2007 | Fujii et al. |
| 7,385,654 | B2 | 6/2008 | Mitsui et al. |
| 7,397,064 | B2 | 7/2008 | Yamazaki et al. |
| 7,629,610 | B2 | 12/2009 | Yamazaki et al. |
| 7,688,290 | B2 | 3/2010 | Yamazaki et al. |
| 8,253,662 | B2 | 8/2012 | Yamazaki et al. |
| 8,441,209 | B2 | 5/2013 | Yamazaki et al. |
| 8,743,028 | B2 | 6/2014 | Yamazaki et al. |
| 8,830,424 | B2 | 9/2014 | Hirakata et al. |
| 9,087,476 | B2 | 7/2015 | Yamazaki et al. |
| 9,088,006 | B2 | 7/2015 | Yamazaki et al. |
| 9,368,089 | B2 | 6/2016 | Yamazaki et al. |
| 9,426,848 | B2 | 8/2016 | Yamazaki et al. |
| 9,627,648 | B2 | 4/2017 | Yamazaki et al. |
| 9,720,277 | B2 | 8/2017 | Yamazaki et al. |
| 2003/0201960 | A1 | 10/2003 | Fujieda |
| 2005/0007353 | A1* | 1/2005 | Smith ............... G09G 3/3233 345/204 |
| 2005/0225683 | A1* | 10/2005 | Nozawa ............ G09G 3/2014 348/801 |
| 2006/0038758 | A1* | 2/2006 | Routley ........... G09G 3/3233 345/81 |
| 2006/0072047 | A1 | 4/2006 | Sekiguchi |
| 2006/0119548 | A1 | 6/2006 | Lan et al. |
| 2006/0250330 | A1* | 11/2006 | Fish ................. G09G 3/3233 345/76 |
| 2006/0256048 | A1* | 11/2006 | Fish ................. G09G 3/3233 345/81 |
| 2006/0273998 | A1* | 12/2006 | Young .............. G09G 3/3233 345/81 |
| 2007/0241998 | A1* | 10/2007 | Fish ................. G09G 3/3233 345/76 |
| 2008/0180618 | A1 | 7/2008 | Fujieda |
| 2008/0203930 | A1* | 8/2008 | Budzelaar ........ G09G 3/3233 315/169.1 |
| 2008/0204384 | A1 | 8/2008 | Lee et al. |
| 2009/0159893 | A1* | 6/2009 | Otani .............. H01L 31/112 257/66 |
| 2009/0243498 | A1* | 10/2009 | Childs ............. G09G 3/3233 315/169.3 |
| 2010/0149079 | A1* | 6/2010 | Yamashita ........ G09G 3/3233 345/87 |
| 2010/0171905 | A1 | 7/2010 | Huang et al. |
| 2010/0177075 | A1* | 7/2010 | Fish ................. G09G 3/2014 345/207 |
| 2013/0043796 | A1* | 2/2013 | Ko .................. G09G 3/3233 315/151 |
| 2013/0135185 | A1 | 5/2013 | Nagatsuka et al. |
| 2016/0190331 | A1 | 6/2016 | Miyake et al. |
| 2017/0032728 | A1* | 2/2017 | Shima .............. H01L 27/3244 |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 | 10/2008 |
| JP | 2011-191750 A | 9/2011 |
| JP | 2013-221965 A | 10/2013 |
| JP | 2014-197522 A | 10/2014 |
| WO | WO-2004/053819 | 6/2004 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.
Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.
Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

* cited by examiner

FIG. 12A
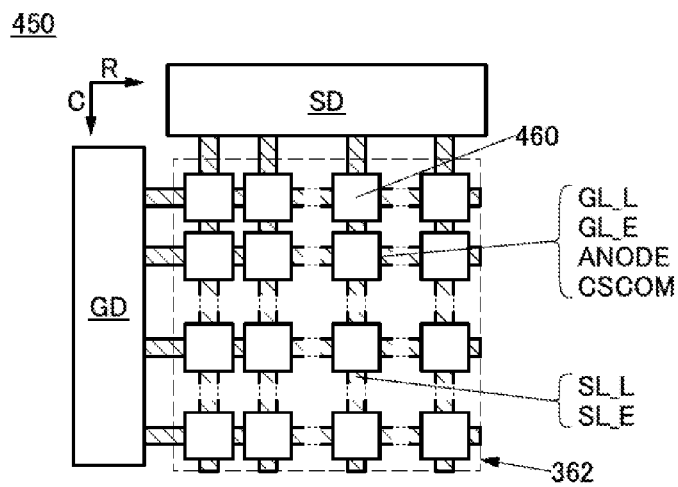
FIG. 12B1
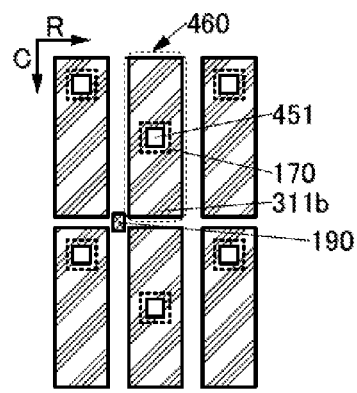
FIG. 12B2
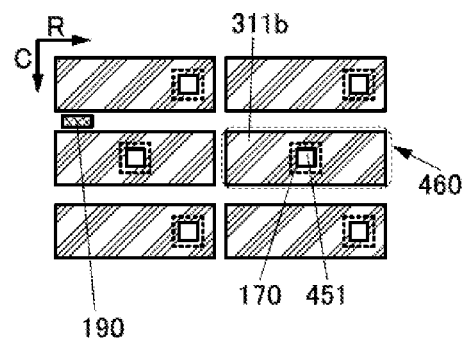
FIG. 12B3
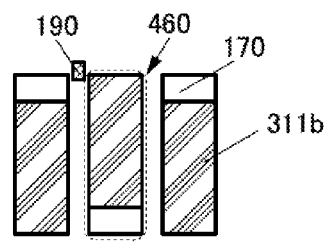
FIG. 12B4
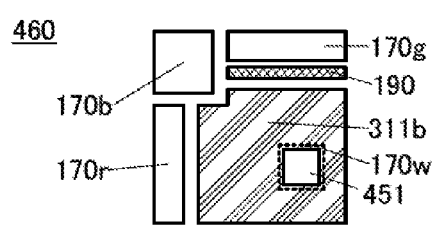

DISPLAY DEVICE, DISPLAY MODULE, AND ELECTRONIC DEVICE

BACKGROUND OF THE INVENTION

1. Field of the Invention

One embodiment of the present invention relates to a display device, a display module, and an electronic device. One embodiment of the present invention relates to a display device, a display module, and an electronic device each of which have a touch sensor function.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

2. Description of the Related Art

Recent display devices have been expected to be applied to a variety of uses. As display devices, for example, light-emitting devices including light-emitting elements and liquid crystal display devices including liquid crystal elements have been developed.

For example, Patent Document 1 discloses a flexible light-emitting device in which an organic electroluminescent (EL) element is used.

Patent Document 2 discloses a transflective liquid crystal display device having a region reflecting visible light and a region transmitting visible light. The transflective liquid crystal display device can be used as a reflective liquid crystal display device in an environment with sufficient external light and as a transmissive liquid crystal display device in an environment with insufficient external light.

REFERENCE

Patent Document

[Patent Document 1] Japanese Published Patent Application No. 2014-197522
[Patent Document 2] Japanese Published Patent Application No. 2011-191750

SUMMARY OF THE INVENTION

It is important to reduce the power consumption of display devices for mobile applications, such as portable information terminals.

The visibility of a display device largely depends on the usage environment. Even though the luminance of an image displayed on the display device is not changed, the image might be perceived to be too dark under strong external light (under high illuminance), whereas the image might be perceived to be too bright under weak external light (under low illuminance). Thus, depending on the usage environment, the visibility of the display device might be decreased.

An object of one embodiment of the present invention is to provide a display device with low power consumption. An object of one embodiment of the present invention is to provide a display device having high visibility regardless of the ambient brightness. An object of one embodiment of the present invention is to provide an all-weather display device. An object of one embodiment of the present invention is to provide a convenient display device. An object of one embodiment of the present invention is to reduce the thickness or weight of a display device. An object of one embodiment of the present invention is to provide a novel display device, a novel input/output device, a novel display module, a novel electronic device, or the like.

Note that the description of these objects does not preclude the existence of other objects. One embodiment of the present invention does not necessarily achieve all the objects. Other objects can be derived from the description of the specification, the drawings, and the claims.

A display device of one embodiment of the present invention includes a light-receiving element, a display element, a first transistor, and a second transistor. One of a source and a drain of the first transistor is electrically connected to a first electrode of the light-receiving element and one of a source and a drain of the second transistor. The display device has a function of, by turning on the second transistor, changing the gray level of the display element in accordance with the amount of light detected by the light-receiving element. The gray level of the display element preferably increases with an increase in the amount of light detected by the light-receiving element.

A display device of one embodiment of the present invention includes a photodetector circuit and a pixel circuit. The photodetector circuit includes a light-receiving element, a first transistor, and a second transistor. The pixel circuit includes a light-emitting element and a third transistor. One of a source and a drain of the first transistor is electrically connected to a first electrode of the light-receiving element and one of a source and a drain of the second transistor. The other of the source and the drain of the second transistor is electrically connected to one of two gates of the third transistor. One of a source and a drain of the third transistor is electrically connected to a first electrode of the light-emitting element. The pixel circuit may include a liquid crystal element that reflects visible light. In this case, the display device has a function of displaying an image with the use of light emitted from the light-emitting element and/or light reflected from the liquid crystal element. Furthermore, the display device may include a signal generation circuit, and the pixel circuit may include a fourth transistor. One of a source and a drain of the fourth transistor is electrically connected to the other of the two gates of the third transistor. The photodetector circuit has a function of outputting a first signal corresponding to the amount of light detected by the light-receiving element. The signal generation circuit has a function of generating a second signal corresponding to the first signal and supplying the second signal to a gate of the fourth transistor.

A display device of one embodiment of the present invention includes a photodetector circuit and a pixel circuit. The photodetector circuit includes a light-receiving element, a first transistor, and a second transistor. The pixel circuit includes a liquid crystal element and a third transistor. One of a source and a drain of the first transistor is electrically connected to a first electrode of the light-receiving element and one of a source and a drain of the second transistor. The other of the source and the drain of the second transistor is electrically connected to one of a source and a drain of the third transistor. The one of the source and the drain of the third transistor is electrically connected to a first electrode of the liquid crystal element.

In each of the display devices with the above configurations, the photodetector circuit may include a fifth transistor.

One of a source and a drain of the fifth transistor is electrically connected to the one of the source and the drain of the first transistor, and the other of the source and the drain of the fifth transistor is electrically connected to the first electrode of the light-receiving element; thus, the one of the source and the drain of the first transistor is electrically connected to the first electrode of the light-receiving element.

In each of the display devices with the above configurations, the second transistor preferably includes an oxide semiconductor in a channel formation region.

Each of the display devices with the above configurations preferably has a function of detecting a touch motion. The pixel circuit is preferably electrically connected to a sensor driver circuit. The photodetector circuit preferably has a function of outputting, to the sensor driver circuit, a signal corresponding to the amount of light detected by the light-receiving element.

One embodiment of the present invention is a display module including a display device with any of the above configurations and a circuit board such as a flexible printed circuit (FPC).

One embodiment of the present invention is an electronic device including the above display module and at least one of an antenna, a battery, a housing, a camera, a speaker, a microphone, and an operation button.

According to one embodiment of the present invention, a display device with low power consumption can be provided. According to one embodiment of the present invention, a display device having high visibility regardless of the ambient brightness can be provided. According to one embodiment of the present invention, an all-weather display device can be provided. According to one embodiment of the present invention, a convenient display device can be provided. According to one embodiment of the present invention, the thickness or weight of a display device can be reduced. According to one embodiment of the present invention, a novel display device, a novel input/output device, a novel display module, a novel electronic device, or the like can be provided.

Note that the description of these effects does not preclude the existence of other effects. One embodiment of the present invention does not necessarily have all the effects. Other effects can be derived from the description of the specification, the drawings, and the claims.

BRIEF DESCRIPTION OF THE DRAWINGS

FIG. 12A illustrates an example of a display device,
and FIGS. 12B1 to 12B4 illustrate examples of a pixel unit.

DETAILED DESCRIPTION OF THE INVENTION

Figure 1A:
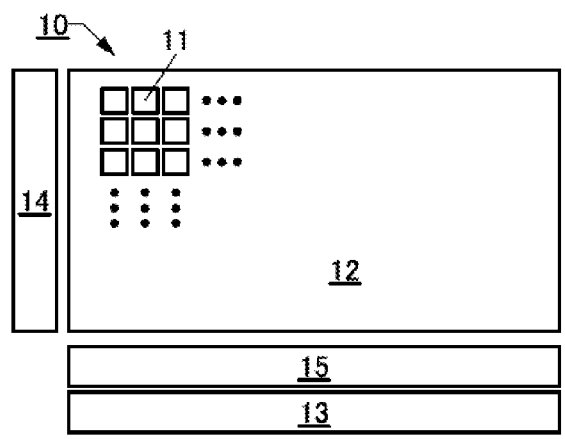
FIG. 1A is a block diagram illustrating an example of a display device.

Embodiments will be described in detail with reference to the drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and description of such portions is not repeated. Furthermore, the same hatching pattern is used for portions having similar functions, and the portions are not especially denoted by reference numerals in some cases.

The position, size, range, or the like of each component illustrated in drawings is not accurately represented in some cases for easy understanding. Therefore, the invention disclosed herein is not necessarily limited to the position, size, range, and the like disclosed in the drawings.

Note that the terms "film" and "layer" can be interchanged with each other depending on the case or circumstances. For example, the term "conductive layer" can be changed into the term "conductive film", and the term "insulating film" can be changed into the term "insulating layer".

Embodiment 1

In this embodiment, a display device of one embodiment of the present invention will be described with reference to FIGS. 1A to 1D, FIGS. 2A and 2B, FIG. 3, FIG. 4, FIG. 5, FIG. 6, and FIG. 7.

The display device of this embodiment has a function of changing the gray level of a display element in accordance with the amount of light detected by a light-receiving element.

For example, when the display device is placed in dark surroundings (in other words, when the illuminance of the environment where the display device is used is low or when external light is weak), a small amount of light is delivered to the light-receiving element; when the display device is placed in bright surroundings (in other words, when the illuminance of the environment where the display device is used is high or when external light is strong), a large amount of light is delivered to the light-receiving element. In one embodiment of the present invention, the amount of light delivered to the light-receiving element is detected, and the gray level of the display element is changed in accordance with the amount of detected light; thus, an image is displayed with a brightness suitable for the usage environment. When the display device is placed in dark surroundings, the gray level of the display element is reduced, whereby the power consumption can be reduced. When the display device is placed in bright surroundings, the gray level of the display element is increased, whereby the visibility can be improved.

Configuration Example 1 of Display Device

FIG. 1A is a block diagram of a display device 10 of this embodiment. The display device 10 includes a display region 12, a circuit 13, a circuit 14, and a circuit 15.

The display region 12 includes a plurality of pixel units 11.

Figure 1B:
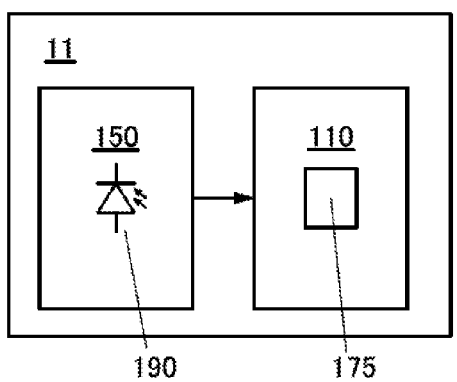
FIGS. 1B and 1C are block diagrams illustrating examples of a pixel unit.
Figure 1C:
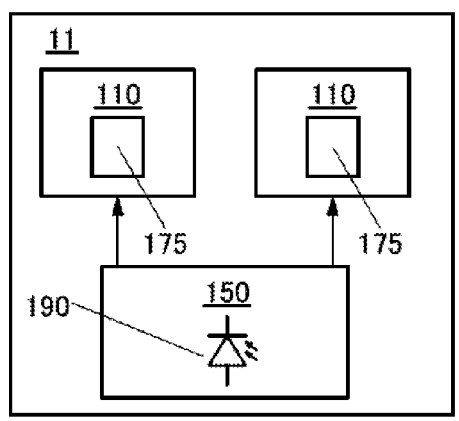

FIGS. 1B and 1C illustrate the pixel unit 11. The pixel unit 11 illustrated in FIG. 1B includes one photodetector circuit 150 and one pixel circuit 110. The pixel unit 11 illustrated in FIG. 1C includes one photodetector circuit 150 and two pixel circuits 110. The number of photodetector circuits 150 and the number of pixel circuits 110 can be determined independently of each other. For example, for one photodetector circuit 150, three or more pixel circuits 110 may be provided.

The photodetector circuit 150 includes a light-receiving element 190.

The pixel circuit 110 includes a display element 175.

As the display element 175, a light-emitting element, a liquid crystal element, an electrophoretic element, a display element using micro electro mechanical systems (MEMS), or the like can be used. As the light-emitting element, a self-luminous element can be used, and an element whose luminance is controlled by current or voltage is included in the category of the light-emitting element. For example, a light-emitting diode (LED), an organic EL element, or an inorganic EL element can be used.

The photodetector circuit 150 and the pixel circuit 110 are electrically connected to each other. The photodetector circuit 150 has a function of supplying, to the pixel circuit 110, a signal or a potential corresponding to the amount of light detected by the light-receiving element 190. When the signal or the potential is supplied to the pixel circuit 110, the gray level (luminance) of the display element 175 is changed. That is, the photodetector circuit 150 can change the intensity of light from the display element 175.

Here, light from the display element 175 corresponds to light emitted from the display element 175 in the case where the display element 175 is a self-luminous element (also referred to as a light-emitting element), and corresponds to light emitted to the outside through the display element 175 in the case where the display element 175 is an element utilizing an optical phenomenon other than light emission, such as polarization, reflection, transmission, refraction, diffraction, scattering, or absorption of light (also referred to as an optical element).

Figure 1D:
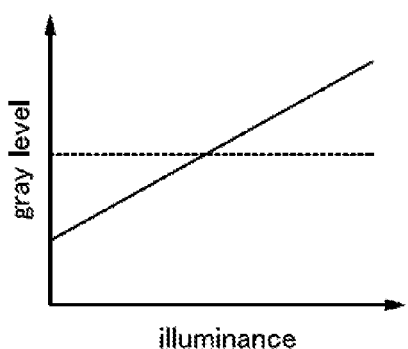
FIG. 1D shows a change in the gray level of a display element.

Next, a change in the gray level of the display element with respect to the illuminance of the environment where the display device is used will be described with reference to FIG. 1D. The solid line indicates the case where display is performed by the display device 10 of this embodiment, and the dashed line indicates the case where an image is displayed at a constant gray level regardless of the illuminance.

The amount of light detected by the light-receiving element 190 increases in proportion to the illuminance. The display device 10 operates such that the gray level of the display element 175 is increased in accordance with the illuminance. That is, in the case where the illuminance is high, the gray level of the display element 175 is increased in order that the display device 10 can display an image with high luminance; in the case where the illuminance is low, the gray level of the display element 175 is decreased in order that the display device 10 can display an image with low luminance. Consequently, a user can always see a displayed image or the like with optimum luminance regardless of the environment where the display device 10 is used. Furthermore, for the display device 10, image processing using a processor or the like is unnecessary; the display device 10 itself can execute such a gray-level conversion process.

Since the plurality of pixel units 11 including the photodetector circuits 150 is arranged in the display region 12, the gray level can be corrected in each of the pixel units 11 in the display region 12 in accordance with the amount of detected light. Consequently, instead of correcting the gray level in the whole display region 12, the gray levels can be independently corrected in a plurality of portions in the display region 12. In the display region 12, for example, only a portion which is locally exposed to light can have higher display luminance than the other portions.

The circuit 13 and the circuit 14 are each a circuit for supplying a signal, a potential, and the like to the pixel circuit 110. For example, one of the circuits 13 and 14 can be used as a signal line driver circuit, and the other thereof can be used as a scan line driver circuit.

The display device 10 may include a scan line driver circuit and/or a signal line driver circuit. Alternatively, the display device 10 may include neither the scan line driver circuit nor the signal line driver circuit.

The circuit 15 supplies a signal, a potential, and the like to the photodetector circuit 150.

The display device 10 may include a driver circuit for a sensor such as a touch sensor (hereinafter, a sensor driver circuit). The circuit 15 is preferably a sensor driver circuit.

The display device 10, which includes the photodetector circuit 150, can serve as a display device having a function of detecting a touch motion. Specifically, the light-receiving element 190 can be used as a detector element of an optical touch panel. A display device having a function of detecting a touch motion can also be regarded as a kind of input/output device.

An integrated circuit (IC) may be electrically connected to the display device 10. The IC includes, for example, at least one of a signal line driver circuit, a scan line driver circuit, and a sensor driver circuit.

Configuration examples of the pixel unit 11 illustrated in FIG. 1A will be described below.

Configuration Example 1 of Pixel Unit

Figure 2A:
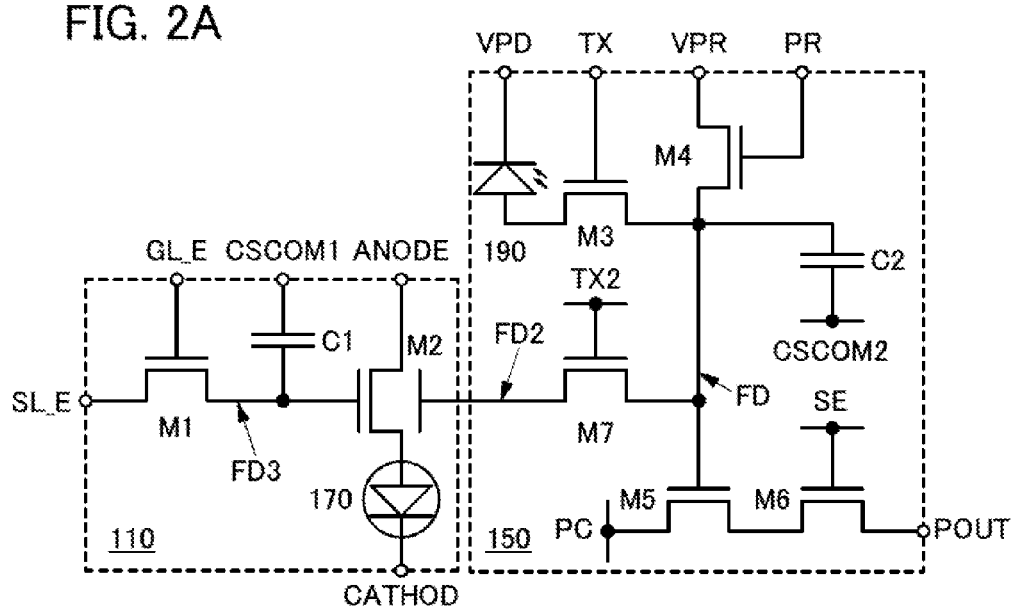
FIG. 2A is a circuit diagram illustrating an example of a pixel unit.

FIG. 2A is a circuit diagram illustrating the photodetector circuit 150 and the pixel circuit 110 included in the pixel unit. In the pixel unit, the photodetector circuit 150 and the pixel circuit 110 are electrically connected to each other. In this configuration example, a light-emitting element 170 is used as the display element 175. The configuration in FIG. 2A can be employed not only in the case where the display element 175 is the light-emitting element 170 but also in the case where a variety of elements are used, namely an element whose gray level is changed by current flowing therethrough or an element whose gray level is changed by voltage applied thereto.

The pixel circuit 110 includes the light-emitting element 170, a transistor M1, a transistor M2, and a capacitor C1. The transistor M1 includes one gate. The transistor M2 includes a first gate and a second gate.

A first electrode of the light-emitting element 170 is electrically connected to one of a source and a drain of the transistor M2. A second electrode of the light-emitting element 170 is electrically connected to a wiring CATHOD. The first electrode and the second electrode of the light-emitting element 170 function as an anode and a cathode, respectively.

A gate of the transistor M1 is electrically connected to a wiring GL_E. One of a source and a drain of the transistor M1 is electrically connected to a wiring SL_E, and the other thereof is connected to one electrode of the capacitor C1 and the first gate of the transistor M2.

Here, a node where the other of the source and the drain of the transistor M1, the one electrode of the capacitor C1, and the first gate of the transistor M2 are connected to each other is referred to as a node FD3.

The other of the source and the drain of the transistor M2 is electrically connected to a wiring ANODE.

The other electrode of the capacitor C1 is electrically connected to a wiring CSCOM1.

The wiring GL_E is supplied with a signal from one of the circuits 13 and 14, and the wiring SL_E is supplied with a signal from the other thereof. For example, the wiring GL_E is supplied with a scan signal, and the wiring SL_E is supplied with a video signal. The wiring ANODE, the wiring CATHOD, and the wiring CSCOM1 are each supplied with a predetermined potential. The potential supplied to the wiring ANODE is higher than the potential supplied to the wiring CATHOD.

Note that the magnitude relation between these potentials may be inverted depending on the direction of the diode characteristics of the light-emitting element 170. Alternatively, the light-emitting element 170 may be connected in series to the transistor M2 so as to be provided between the transistor M2 and the wiring ANODE.

Next, an example of the operation of the pixel circuit 110 will be described. The conduction state of the transistor M1 is controlled by the wiring GL_E. When the transistor M1 is on, an analog value corresponding to video data input from the wiring SL_E is stored at the node FD3. The capacitor C1 has a function of retaining a charge of the node FD3. The current flowing between the source and the drain of the transistor M2 changes in accordance with the potential of the node FD3. When current flows into the light-emitting element 170 via the transistor M2, the light-emitting element 170 emits light. The emission intensity of the light-emitting element 170 depends on the amount of current flowing into the light-emitting element 170.

The photodetector circuit 150 includes the light-receiving element 190, a transistor M3, a transistor M4, a transistor M5, a transistor M6, a transistor M7, and a capacitor C2. In this specification and the like, the transistor M7 is a component of the photodetector circuit 150; however, the configuration is not limited thereto. The transistor M7 may be provided outside the photodetector circuit 150; for example, the pixel circuit 110 may include the transistor M7.

A first electrode of the light-receiving element 190 is electrically connected to one of a source and a drain of the transistor M3. A second electrode of the light-receiving element 190 is electrically connected to a wiring VPD. The first electrode and the second electrode of the light-receiving element 190 function as an anode and a cathode, respectively.

A gate of the transistor M3 is electrically connected to a wiring TX. The other of the source and the drain of the transistor M3 is connected to one of a source and a drain of the transistor M4, a gate of the transistor M5, one of a source and a drain of the transistor M7, and one electrode of the capacitor C2.

The photodetector circuit 150 does not necessarily include the transistor M3. In this case, the first electrode of the light-receiving element 190 is electrically connected to the one of the source and the drain of the transistor M4.

Here, a node where the other of the source and the drain of the transistor M3, the one of the source and the drain of the transistor M4, the gate of the transistor M5, the one of the source and the drain of the transistor M7, and the one electrode of the capacitor C2 are connected to each other is referred to as a node FD.

A gate of the transistor M4 is electrically connected to a wiring PR. The other of the source and the drain of the transistor M4 is electrically connected to a wiring VPR.

One of a source and a drain of the transistor M5 is electrically connected to a wiring PC, and the other thereof is electrically connected to one of a source and a drain of the transistor M6.

A gate of the transistor M6 is electrically connected to a wiring SE. The other of the source and the drain of the transistor M6 is electrically connected to a wiring POUT.

A gate of the transistor M7 is electrically connected to a wiring TX2. The other of the source and the drain of the transistor M7 is electrically connected to the second gate of the transistor M2 included in the pixel circuit 110.

Here, a node where the other of the source and the drain of the transistor M7 and the second gate of the transistor M2 are connected to each other is referred to as a node FD2.

The transistor M7 preferably includes an oxide semiconductor in a channel formation region. For example, in a transistor including a channel formation region in silicon, it is difficult to control the drain current to be approximately $10^{-14}$ A by adjusting the gate voltage. In contrast, in a transistor including an oxide semiconductor in a channel formation region, it is possible to reduce the drain current to approximately $10^{-23}$ A by adjusting the gate voltage. Therefore, such a transistor is easily controlled such that the potential of the node FD2 is hardly changed, as compared with the transistor including the channel formation region in silicon.

It is preferable that, besides the transistor M7, each of the transistors illustrated in FIG. 2A also include an oxide semiconductor in a channel formation region.

Note that there is no particular limitation on the structure of the transistor included in the display device. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be suppressed.

As a semiconductor material used for the semiconductor layer of the transistor, for example, an element of Group 14 (e.g., silicon or germanium), a compound semiconductor, or an oxide semiconductor can be used. Typically, a semiconductor containing silicon, a semiconductor containing gallium arsenide, an oxide semiconductor containing indium, or the like can be used.

In particular, a semiconductor material having a wider band gap and a lower carrier density than silicon is preferably used because off-state current of the transistor can be reduced.

By using the same semiconductor material for all the transistors in the display device, the manufacturing process can be simplified.

It is preferable that the transistor M1, the transistor M3, the transistor M4, and the transistor M7 which are connected to the respective nodes each have low off-state current in order to retain charges accumulated in the nodes for a long time. A transistor whose channel formation region is formed in an oxide semiconductor having a wider band gap and a lower intrinsic carrier density than silicon can have much lower off-state current than a transistor formed using a normal semiconductor such as silicon or germanium and is therefore suitable as each of the transistors M1, M3, M4, and M7.

In FIG. 2A and the like, the transistors other than the transistor M2 each include only one gate. In the case where each of the transistors includes a pair of gates between which a semiconductor film is positioned, potentials at the same level may be applied to the pair of gates, or a fixed potential such as a ground potential may be applied to only one of the gates. By controlling the level of a potential applied to the other gate, the threshold voltage of each of the transistors can be controlled.

The other electrode of the capacitor C2 is electrically connected to a wiring CSCOM2. The capacitor C2 has a function of retaining the potential of the node FD. The capacitor C2 is not necessarily provided.

A potential $V_{VPD}$ is supplied to the wiring VPD. A potential $V_{VPR}$ is supplied to the wiring VPR. Here, the potential $V_{VPD}$ is preferably higher than the potential $V_{VPR}$.

The wiring TX, the wiring TX2, the wiring SE, and the wiring PR are each supplied with a signal from the circuit 15.

Next, an example of the operation of the photodetector circuit 150 will be described. The conduction state of the transistor M3 is controlled by the wiring TX. When the transistor M3 is on, the potential of the node FD changes in accordance with the current flowing through the light-receiving element 190. That is, the potential of the node FD changes in accordance with the amount of light delivered to the light-receiving element 190.

The transistor M4 has a function of resetting the potential of the node FD. The conduction state of the transistor M4 is controlled by the wiring PR. When the transistor M4 is on, the potential of the node FD is reset to be equal to that of the wiring VPR.

The transistor M5 has a function of amplifying data of the node FD. The conduction state of the transistor M5 is controlled by the potential of the node FD. The potential of the wiring POUT is determined in accordance with the potential of the node FD.

The transistor M6 has a function of selecting a specific row in the pixel array. The conduction state of the transistor M6 is controlled by the wiring SE. When the transistor M6 is on, a specific potential corresponding to the potential of the node FD is output from the wiring POUT. From the wiring POUT, a potential (a signal) corresponding to the amount of light delivered to the light-receiving element 190 can be output to the sensor driver circuit.

The conduction state of the transistor M7 is controlled by the wiring TX2. When the transistor M7 is on, the potential of the node FD is transferred to the node FD2.

By turning off the transistor M7, the potential of the node FD2 is retained. Since the photodetector circuit 150 includes the transistor M7, the potential of the second gate of the transistor M2 can be retained during operations other than the transfer operation. Thus, the potential of the second gate of the transistor M2 can be prevented from being unnecessarily changed by the operation of the photodetector circuit 150. Accordingly, an undesirable change in the gray level of the light-emitting element 170 does not occur, so that the display quality can be improved.

In the example illustrated in FIG. 2A, the capacitor C1 is electrically connected to the wiring CSCOM1, and the capacitor C2 is electrically connected to the wiring CSCOM2; however, the capacitors C1 and C2 may be electrically connected to the same wiring. The wiring CSCOM1 and the wiring CSCOM2 may be supplied with different potentials or the same potential.

Example 1 of Driving Method of Pixel Unit

An example of a driving method of the pixel unit 11 will be described with reference to FIG. 2B and FIG. 3. Here, the case where all the transistors included in the pixel unit 11 are n-channel transistors will be described.

Figure 2B:
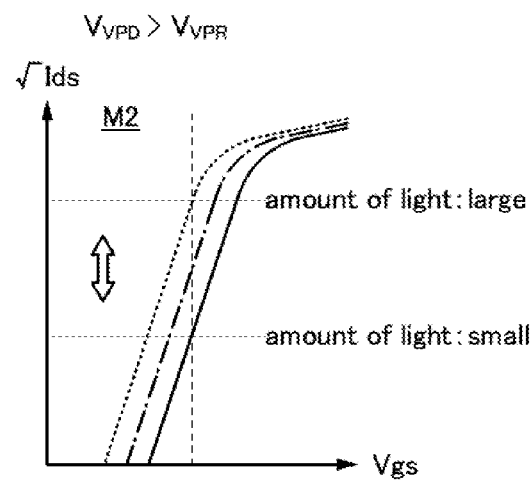
FIG. 2B shows $V_{gs}$-$I_{ds}$ characteristics of a transistor.

FIG. 2B schematically illustrates current ($I_{ds}$) flowing between the source and the drain of the transistor M2 with respect to voltage ($V_{gs}$) between the first gate and the source of the transistor M2. In FIG. 2B, $V_{gs}$ is plotted on a linear scale on the horizontal axis, and a square root of $I_{ds}$ ($\sqrt{I_{ds}}$) is plotted on a linear scale on the vertical axis.

Figure 3:
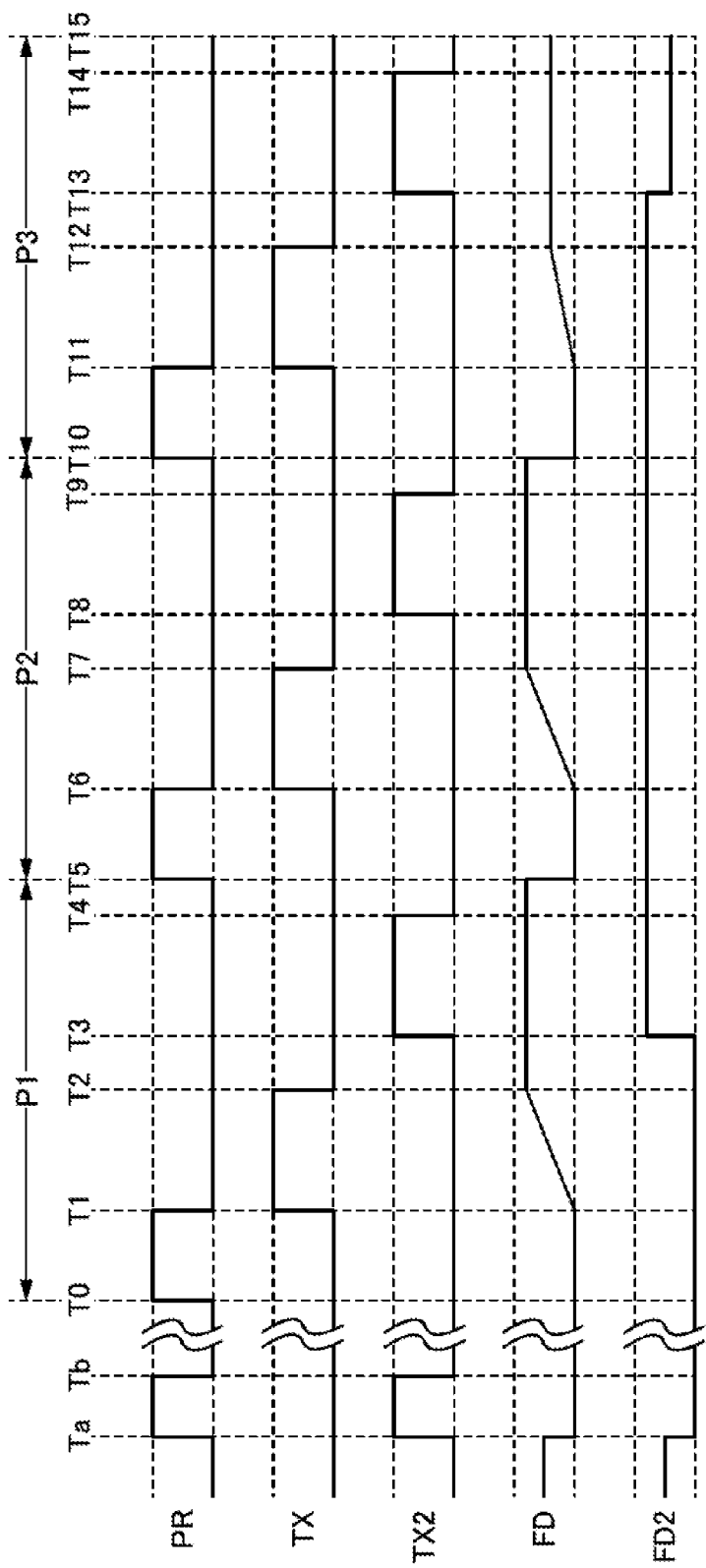
FIG. 3 is an example of a timing chart of a photodetector circuit.

FIG. 3 is a timing chart illustrating the operation of the pixel unit 11.

<Initialization Operation>

In a period from Time Ta to Time Tb in FIG. 3, an initialization operation of the node FD2 is performed.

At Time Ta, the potential of the wiring PR and the potential of the wiring TX2 are changed from a low level to a high level to turn on the transistor M4 and the transistor M7. A potential close to the potential of the wiring VPR is supplied to the node FD and the node FD2, so that the amount of charge retained at the node FD and the node FD2 is reset to the initial state. Note that the wiring TX is supplied with a low-level potential; thus, the transistor M3 is off.

At Time Tb, the potential of the wiring PR and the potential of the wiring TX2 are changed from the high level to the low level to turn off the transistor M4 and the transistor M7.

In a period from Time T0 to Time T15 in FIG. 3, photodetection is performed three times. In FIG. 3, a first detection period P1 lasts from Time T0 to Time T5, a second detection period P2 lasts from Time T5 to Time T10, and a third detection period P3 lasts from Time T10 to Time T15.

Note that there is no particular limitation on the number of times, the cycle, and the like of the photodetection. The repetition of the photodetection enables the gray level of the display element to be changed in accordance with a change in brightness of the usage environment.

<First Detection Period P1>
<<Reset Operation>>

At Time T0, the potential of the wiring PR is changed from the low level to the high level to turn on the transistor M4. A potential close to the potential of the wiring VPR is supplied to the node FD, so that the amount of charge retained at the node FD is reset to the initial state. The wiring TX and the wiring TX2 are each supplied with a low-level potential; thus, the transistor M3 and the transistor M7 are off.

Since the initialization operation is performed before the first detection period P1, a potential close to the potential of the wiring VPR is supplied to the node FD2. In the case where the photodetection is performed before the first detection period P1, the node FD2 retains a potential in the photodetection.

Then, the potential of the wiring PR is changed from the high level to the low level to turn off the transistor M4. Although the low-level potential is supplied to the wiring PR at Time T1 in the example illustrated in FIG. 3, the low-level potential may be supplied before Time T1.

<<Light Exposure Operation>>

At Time T1, the potential of the wiring TX is changed from the low level to the high level to turn on the transistor M3.

The wiring VPD is supplied with the potential $V_{VPD}$ which is higher than the potential $V_{VPR}$ of the wiring VPR. Since the transistor M3 is on at this time, reverse bias voltage is applied to the light-receiving element 190. When light is delivered to the light-receiving element 190 to which the reverse bias voltage is being applied, current flows from the cathode to the anode of the light-receiving element 190. The current value changes depending on the light intensity, that is, the amount of light to which the light-receiving element 190 is exposed. The larger the amount of light to which the light-receiving element 190 is exposed, the larger the current value and the amount of charge flowing into the node FD. In contrast, the smaller the amount of light to which the light-receiving element 190 is exposed, the smaller the current value and the amount of charge flowing into the node FD. In other words, the larger the amount of light to which the light-receiving element 190 is exposed, the larger a change in the potential of the node FD (the potential of the node FD comes close to the potential $V_{VPD}$); the smaller the amount of light to which the light-receiving element 190 is exposed, the smaller a change in the potential of the node FD (the potential of the node FD comes close to the potential $V_{VPR}$).

At Time T2, the potential of the wiring TX is changed from the high level to the low level to turn off the transistor M3. As a result, the potential of the node FD is retained.

<<Transfer Operation>>

Then, the potential of the wiring TX2 is changed from the low level to the high level to turn on the transistor M7; thus, the potential of the node FD is transferred to the node FD2. Although the high-level potential is supplied to the wiring TX2 at Time T3 in the example illustrated in FIG. 3, the high-level potential may be supplied at Time T2.

When the potential of the node FD is transferred to the node FD2, the potential of the node FD might decrease slightly. In this case, the capacitance of the capacitor C2 is set to be higher than the combined capacitance of the parasitic capacitance of the node FD2 and the back gate capacitance of the transistor M2, whereby a change in the potential of the node FD can be reduced. For example, the capacitance value of the capacitor C2 is preferably five times or more or ten times or more of the combined capacitance value.

The node FD2 is connected to the second gate of the transistor M2. Thus, a change in the potential of the node FD2 causes a change in the threshold voltage of the transistor M2.

In FIG. 2B, the $V_{gs}$-$I_{ds}$ characteristics of the transistor M2 are represented by a solid line, a dashed-dotted line, and a dashed line in ascending order of the amount of light to which the light-receiving element 190 is exposed. The smaller the amount of light exposure, the lower the potential of the node FD2; thus, the threshold voltage is positioned on the positive side as indicated by the solid line. In contrast, the larger the amount of light exposure, the higher the potential of the node FD2; thus, the threshold voltage is positioned on the negative side as indicated by the dashed line. Accordingly, when a given potential is supplied to the first gate of the transistor M2, a smaller amount of light exposure allows lower current to flow between the source and the drain of the transistor M2 and a larger amount of light exposure allows higher current to flow. As a result, the smaller the amount of light exposure, the lower the luminance of light emitted from the light-emitting element 170; the larger the amount of light exposure, the higher the luminance of light emitted from the light-emitting element 170.

Therefore, in a place with strong external light, the luminance of the display device 10 including the pixel units 11 is increased, and thus, the visibility is improved. In contrast, in a place with weak external light, the luminance of the display device 10 is reduced, and thus, eye-friendly display can be performed. The luminance of the display device 10 can be adjusted in accordance with the intensity of external light, so that the power consumption can be reduced. Such functions of the display device 10 can be achieved without using an external arithmetic device, a special IC, or the like. Therefore, such functions can be achieved without an increase in the number of components of the display device 10 or an electronic device including the display device 10.

The fluctuation range of the threshold voltage of the transistor M2 can be defined by the potential $V_{VPD}$ and the potential $V_{VPR}$. For example, when the potential $V_{VPR}$ is set to a negative potential and the potential $V_{VPD}$ is set to a negative potential higher than the potential $V_{VPR}$, the threshold voltage of the transistor M2 shifts in the positive direction; thus, the transistor M2 can be normally off. Alternatively, when the potential $V_{VPR}$ is set to a negative potential and the potential $V_{VPD}$ is set to a positive potential, the transistor M2 can be either normally off or normally on.

As described above, the emission intensity of the light-emitting element 170 can be optimized in accordance with the intensity of light delivered to the light-receiving element 190.

At Time T4, the potential of the wiring TX2 is changed from the high level to the low level to turn off the transistor M7. As a result, the potential of the node FD2 is retained. In a subsequent period in which the low-level potential of the wiring TX2 is retained, the potential of the node FD2 is retained. Accordingly, the gray level of the light-emitting element 170 can be prevented from being unintentionally changed by the operation of the photodetector circuit 150. Specifically, the gray level of the light-emitting element 170 can be prevented from being changed by an operation in which the photodetector circuit 150 is refreshed to check whether the intensity of external light is changed or not, by a touch detection operation with the photodetector circuit 150, or the like.

In the case where the photodetector circuit 150 is used as an optical touch sensor, the potential of the node FD is output to the wiring POUT via the transistor M5 and the transistor M6.

The output in each detection period can be performed after the potential of the node FD becomes a potential corresponding to the intensity of light delivered to the light-receiving element 190. For example, in the first detection period P1, the output is performed between Time T2 and Time T5.

Specifically, while the potential of the wiring TX is at the low level, the potential of the wiring SE is changed from the low level to the high level to turn on the transistor M6. Consequently, the wiring PC and the wiring POUT are electrically connected to each other through the transistor M5 and the transistor M6.

At a rate depending on the potential of the node FD, the potential of the wiring POUT comes closer to the potential of the wiring PC.

Here, the rate at which the potential of the wiring POUT changes depends on the current between the source and the drain of the transistor M5. That is, the rate depends on the intensity of light delivered to the light-receiving element 190. In other words, by acquiring the potential of the wiring POUT at this time, the amount of light delivered to the light-receiving element 190 can be derived from the voltage of a detection signal. In this manner, a touch motion can be detected. For example, the potential of the wiring POUT in a column selected by a multiplexer 161 is output to a wiring OUT (see FIG. 20 described later).

Furthermore, a period in which a touch motion is detected may be separately provided. In this period, the potentials of the wiring TX and the wiring TX2 are set to the low level. Thus, the potentials of the node FD and the node FD2 are retained, so that a display defect due to the touch detection operation can be suppressed.

Specifically, after operations similar to the reset operation and the light exposure operation, the potential of the wiring SE is changed from the low level to the high level to turn on the transistor M6. Consequently, the wiring PC and the wiring POUT are electrically connected to each other through the transistor M5 and the transistor M6.

At a rate depending on the potential of the node FD, the potential of the wiring POUT comes closer to the potential of the wiring PC.

After that, by acquiring the potential of the wiring POUT, the amount of light delivered to the light-receiving element 190 can be derived from the voltage of a detection signal. In this manner, a touch motion can be detected.

<Second Detection Period P2>

In an example described below, the intensity of light delivered to the light-receiving element 190 in the first detection period P1 is equal to that in the second detection period P2.

<<Reset Operation>>

At Time T5, the potential of the wiring PR is changed from the low level to the high level to turn on the transistor M4. The potential of the wiring VPR is supplied to the node FD, so that the amount of charge retained at the node FD is reset to the initial state. The wiring TX and the wiring TX2 are each supplied with a low-level potential; thus, the transistor M3 and the transistor M7 are off. The potential of the node FD2 is retained.

<<Light Exposure Operation>>

At Time T6, the potential of the wiring PR is changed from the high level to the low level to turn off the transistor M4. In addition, the potential of the wiring TX is changed from the low level to the high level to turn on the transistor M3. In accordance with the intensity of light delivered to the light-receiving element 190, current flows into the light-receiving element 190, so that the potential of the node FD increases.

At Time T7, the potential of the wiring TX is changed from the high level to the low level to turn off the transistor M3. As a result, the potential of the node FD is retained.

<<Transfer Operation>>

At Time T8, the potential of the wiring TX2 is changed from the low level to the high level to turn on the transistor M7; thus, the potential of the node FD is transferred to the node FD2. As described above, since the intensity of light delivered to the light-receiving element 190 in the first detection period P1 is equal to that in the second detection period P2, the potential of the node FD2 does not change.

In the second detection period P2, the reset operation and the light exposure operation cause a change in the potential of the node FD. Here, if the transistor M7 is not provided and the node FD is directly connected to the second gate of the transistor M2, an unnecessary potential change may occur at the second gate of the transistor M2. In contrast, since the photodetector circuit 150 of one embodiment of the present invention includes the transistor M7, the potential of the second gate of the transistor M2 can be retained during operations other than the transfer operation. Accordingly, an undesirable change in the gray level of the light-emitting element 170 does not occur, so that the display quality can be improved.

At Time T9, the potential of the wiring TX2 is changed from the high level to the low level to turn off the transistor M7. As a result, the potential of the node FD2 is retained.

As in the first detection period P1, a touch detection operation can also be performed in the second detection period P2. For example, the touch detection operation can be performed between Time T7 and Time T10.

<Third Detection Period P3>

In an example described below, the intensity of light delivered to the light-receiving element 190 in the third detection period P3 is different from that in the first detection period P1 and the second detection period P2.

<<Reset Operation>>

At Time T10, the potential of the wiring PR is changed from the low level to the high level to turn on the transistor M4. The potential of the wiring VPR is supplied to the node FD, so that the amount of charge retained at the node FD is reset to the initial state. The wiring TX and the wiring TX2 are each supplied with a low-level potential; thus, the transistor M3 and the transistor M7 are off. The potential of the node FD2 is retained.

<<Light Exposure Operation>>

At Time T11, the potential of the wiring PR is changed from the high level to the low level to turn off the transistor M4. In addition, the potential of the wiring TX is changed from the low level to the high level to turn on the transistor M3. In accordance with the intensity of light delivered to the light-receiving element 190, current flows into the light-receiving element 190, so that the potential of the node FD increases.

At Time T12, the potential of the wiring TX is changed from the high level to the low level to turn off the transistor M3. As a result, the potential of the node FD is retained. Here, the intensity of light delivered to the light-receiving element 190 is lower than that in the first detection period P1 and the second detection period P2. The potential of the node FD at Time T12 is lower than the potential of the node FD at Time T2 and Time T7.

<<Transfer Operation>>

At Time T13, the potential of the wiring TX2 is changed from the low level to the high level to turn on the transistor M7; thus, the potential of the node FD is transferred to the node FD2. Since the potential of the node FD at Time T12 is lower than the potential of the node FD at Time T2 and Time T7 (this potential corresponds to the potential of the node FD2 until Time T13), the potential of the node FD2 decreases.

When the potential of the node FD is transferred to the node FD2, the potential of the node FD2 might decrease and the potential of the node FD might increase. As described above, the capacitance of the capacitor C2 is set to be higher than the combined capacitance of the parasitic capacitance of the node FD2 and the back gate capacitance of the transistor M2, whereby a change in the potential of the node FD can be reduced.

In this manner, only when the intensity of light delivered to the light-receiving element 190 is changed from that in the previous detection period, the potential of the node FD2 is changed, so that the emission intensity of the light-emitting element is changed. According to one embodiment of the present invention, the potential of the second gate of the transistor M2 can be properly controlled in accordance with the intensity of external light.

At Time T14, the potential of the wiring TX2 is changed from the high level to the low level to turn off the transistor M7. As a result, the potential of the node FD2 is retained.

As in the first detection period P1, a touch detection operation can also be performed in the third detection period P3. For example, the touch detection operation can be performed between Time T12 and Time T15.

Example 2 of Driving Method of Pixel Unit

In Example 1 of Driving Method described above, the potential of the node FD which has changed in accordance with the amount of light delivered to the light-receiving element 190 is transferred to the node FD2 to control the gray level of the display element. In Example 2 of Driving Method, a driving method in which a user of the display device sets the gray level of the display element to a desired value will be described.

In the following description, the configuration illustrated in FIG. 2A is used as an example; however, the following description also applies to other configurations in this specification.

In Example 2 of Driving Method, the potential of the wiring PR and the potential of the wiring TX2 are set to the high level at a desired timing to turn on the transistor M4 and the transistor M7. At this time, the potential of the node FD and the potential of the node FD2 each become a potential close to the potential of the wiring VPR.

The potential of the wiring VPR may be either fixed or variable. When the potential of the wiring VPR is variable, a potential corresponding to a gray level desired by the user of the display device can be supplied to the node FD2.

After that, the potential of the wiring TX2 is set to the low level, whereby the potential of the node FD2 can be retained.

By performing this operation on the photodetector circuits 150 in all the pixel units 11, the threshold voltages of the transistors M2 in all the pixel units 11 can be controlled.

Note that this operation is performed in a period other than the operation period of the photodetector circuit 150, i.e., performed in a retrace period of the photodetector circuit 150.

Figure 4:
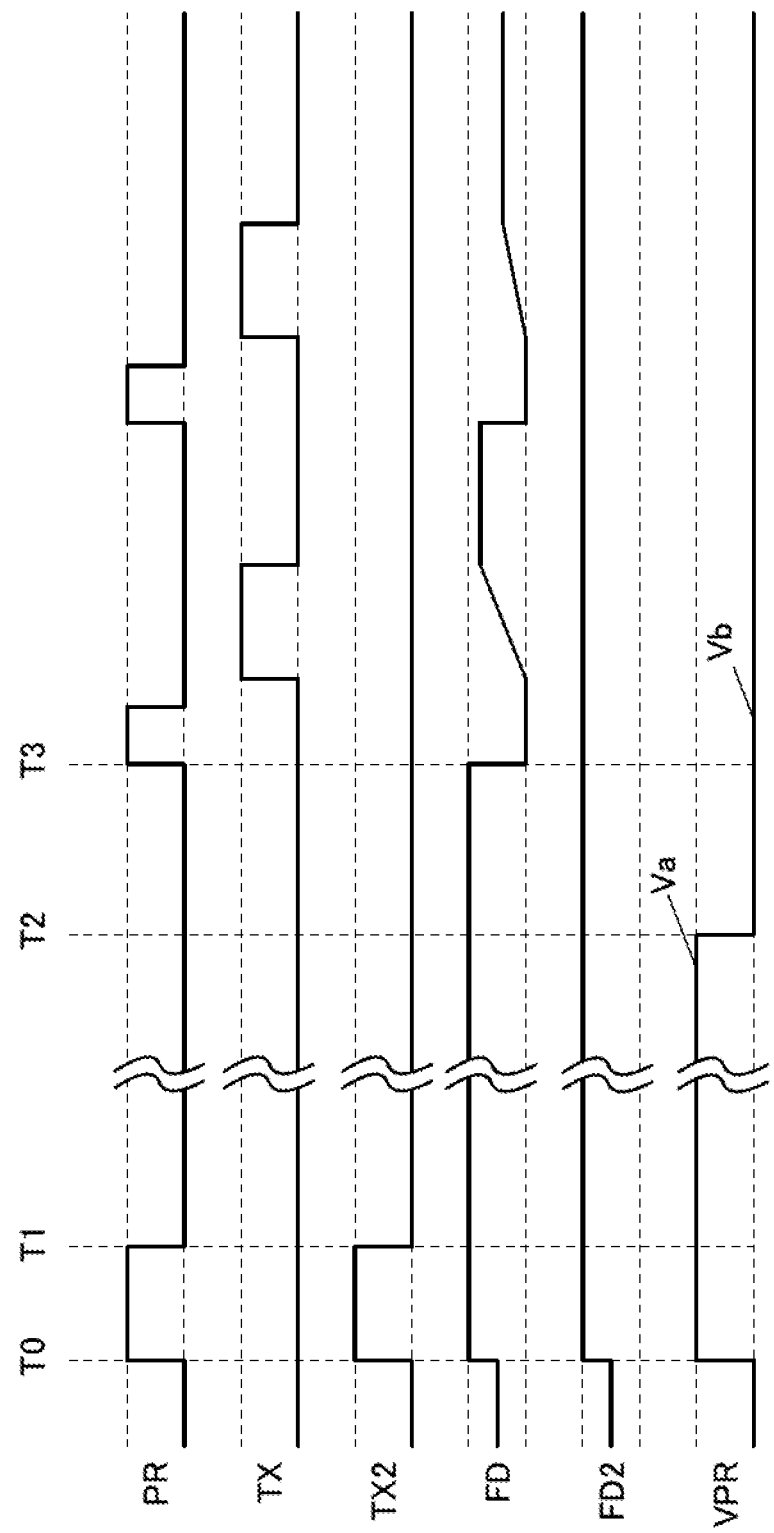
FIG. 4 is an example of a timing chart of a photodetector circuit.

FIG. 4 is a timing chart illustrating the operation of the pixel unit 11.

A period form Time T0 to Time T2 in FIG. 4 corresponds to the retrace period of the photodetector circuit 150.

At Time T0, the potential of the wiring PR is changed from the low level to the high level to turn on the transistor M4. In addition, the potential of the wiring TX2 is changed from the low level to the high level to turn on the transistor M7. The wiring VPR is supplied with a potential $V_a$. Accordingly, a potential close to the potential $V_a$ of the wiring VPR is supplied to the node FD and the node FD2. The wiring TX is supplied with a low-level potential; thus, the transistor M3 is off.

The threshold voltage of the transistor M2 is changed by the potential $V_a$, whereby the emission intensity of the light-emitting element can be set to a desired value.

At Time T1, the potential of the wiring PR is changed from the high level to the low level to turn off the transistor M4. In addition, the potential of the wiring TX2 is changed from the high level to the low level to turn off the transistor M7. As a result, the potential of the node FD2 is retained.

At Time T2, the wiring VPR is supplied with a potential Vb. At Time T2, the retrace period is terminated.

After Time T3, photodetection is performed using the photodetector circuit 150. A touch motion can be detected by the photodetection. The potential of the wiring TX2 is fixed to a low-level potential to prevent the potential of the node FD from being transferred to the node FD2.

As described above, in this example of a driving method, the potential of the node FD2 is determined without using the light-receiving element 190, so that an image is displayed at a constant gray level regardless of the intensity of external light. Accordingly, an image can be displayed at a gray level desired by a user of the display device. In this example of a driving method, image processing using a processor or the like is unnecessary; the display device itself can execute such a gray-level conversion process.

Modification Example 1

Figure 5:
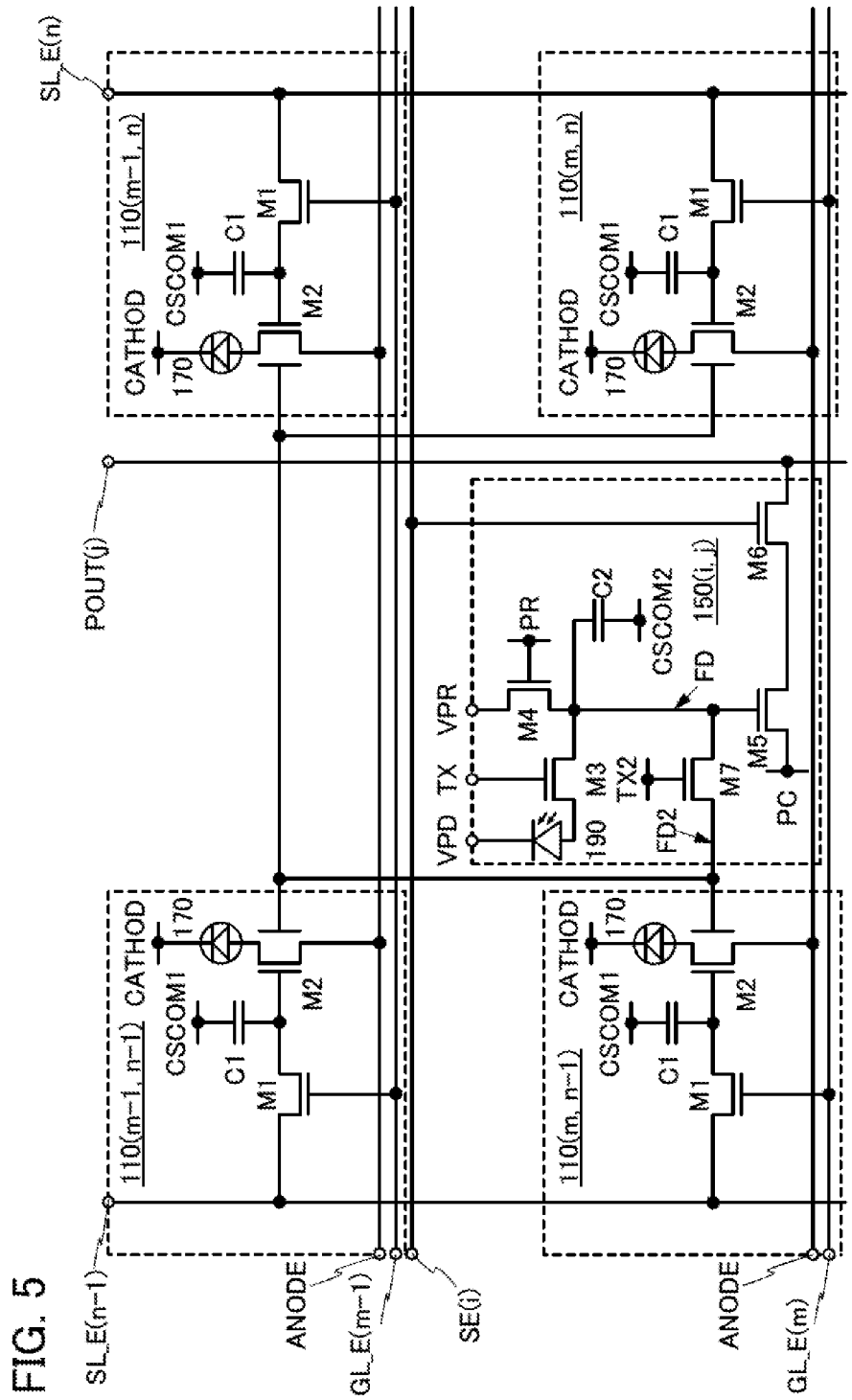
FIG. 5 is a circuit diagram illustrating an example of a pixel unit.

In the example illustrated in FIG. 2A, for one photodetector circuit 150, one pixel circuit 110 is provided. FIG. 5 illustrates an example in which for one photodetector circuit 150, four pixel circuits 110 are provided.

A plurality of pixel circuits 110 is arranged in a matrix of m rows and n columns (m and n are each an integer of 2 or more).

The pixel circuits 110 in the m−1-th row are electrically connected to a wiring GL_E(m−1), and the pixel circuits 110 in the m-th row are electrically connected to a wiring GL_E(m).

The pixel circuits 110 in the n−1-th column are electrically connected to a wiring SL_E(n−1), and the pixel circuits 110 in the n-th column are electrically connected to a wiring SL_E(n).

A photodetector circuit 150(i,j) (i and j are each an integer of 1 or more) is electrically connected to a wiring SE(i) and a wiring POUT(j). The display device may include a plurality of wirings TX, a plurality of wirings TX2, and a plurality of wirings PR. For example, the photodetector circuit 150(*i,j*) may be electrically connected to a wiring TX(*i*), a wiring TX2(*i*), and a wiring PR(*i*).

The configurations of the photodetector circuit 150 and each of the four pixel circuits 110 are the same as those in FIG. 2A. In FIG. 5, the node FD2 is connected to the second gates of the transistors M2 of the four pixel circuits 110. In accordance with a change in the potential of the node FD2 in the photodetector circuit 150, the luminances of the light-emitting elements 170 included in the four pixel circuits 110 can be changed at the same time.

Modification Example 2

Figure 6:
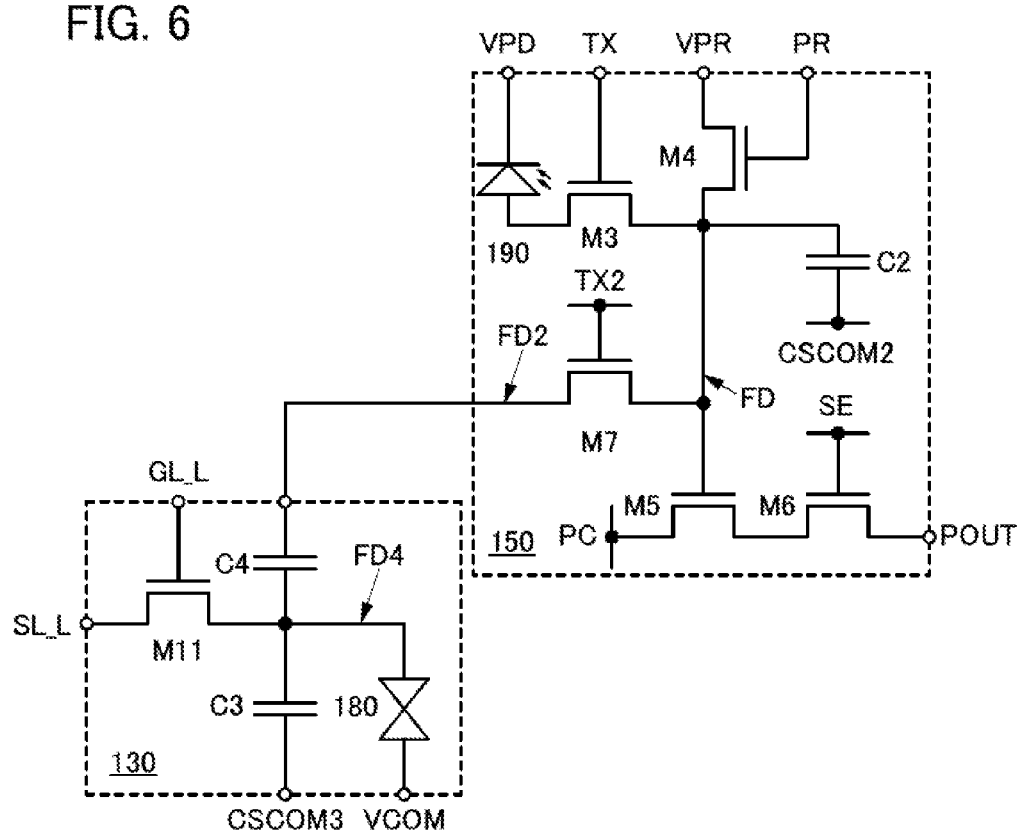
FIG. 6 is a circuit diagram illustrating an example of a pixel unit.

FIG. 6 is a circuit diagram in which a liquid crystal element 180 is used as the display element 175. The configuration in FIG. 6 can be employed not only in the case where the display element 175 is the liquid crystal element 180 but also in the case where a variety of elements are used, namely an element whose gray level is changed by voltage applied thereto.

A pixel circuit 130 includes the liquid crystal element 180, a transistor M11, a capacitor C3, and a capacitor C4. The transistor M11 includes one gate.

A first electrode of the liquid crystal element 180 is electrically connected to one of a source and a drain of the transistor M11, one electrode of the capacitor C3, and one electrode of the capacitor C4. A second electrode of the liquid crystal element 180 is electrically connected to a wiring VCOM.

Here, a node where the first electrode of the liquid crystal element 180, the one of the source and the drain of the transistor M11, the one electrode of the capacitor C3, and the one electrode of the capacitor C4 are connected to each other is referred to as a node FD4.

A gate of the transistor M11 is electrically connected to a wiring GL_L. The other of the source and the drain of the transistor M11 is electrically connected to a wiring SL_L.

To insulate the node FD4 to a great extent and retain charges accumulated in the node FD4 for a long time, the transistor M11 preferably has low off-state current. The transistor M11 preferably includes an oxide semiconductor in a channel formation region.

The other electrode of the capacitor C3 is electrically connected to a wiring CSCOM3.

The other electrode of the capacitor C4 is electrically connected to the other of the source and the drain of the transistor M7.

The wiring GL_L is supplied with a signal from one of the circuits 13 and 14 (see FIG. 1A), and the wiring SL_L is supplied with a signal from the other thereof. For example, the wiring GL_L is supplied with a scan signal, and the wiring SL_L is supplied with a video signal. The wiring VCOM and the wiring CSCOM3 are each supplied with a predetermined potential.

The configuration of the photodetector circuit 150 is the same as that in FIG. 2A except that the other of the source and the drain of the transistor M7 is electrically connected to the other electrode of the capacitor C4.

The conduction state of the transistor M11 is controlled by the wiring GL_L. When the transistor M11 is on, an analog value corresponding to video data input from the wiring SL_L is stored at the node FD4. The capacitor C3 has a function of retaining a charge of the node FD4. The alignment of liquid crystal is controlled by the voltage between the node FD4 and the wiring VCOM, whereby the luminance of light extracted through the liquid crystal element 180 is changed. The gray level of the liquid crystal element 180 can be controlled in this manner.

The node FD2 and the node FD4 are capacitively coupled through the capacitor C4. Therefore, when the transistor M11 is turned off and the potential of the node FD2 is changed, the potential of the node FD4 in an electrically floating state is also changed. Consequently, the voltage applied to the liquid crystal element 180 is changed; thus, the gray level of the liquid crystal element 180 can be changed.

Example of Cross-Sectional Structure of Display Device

Figure 7:
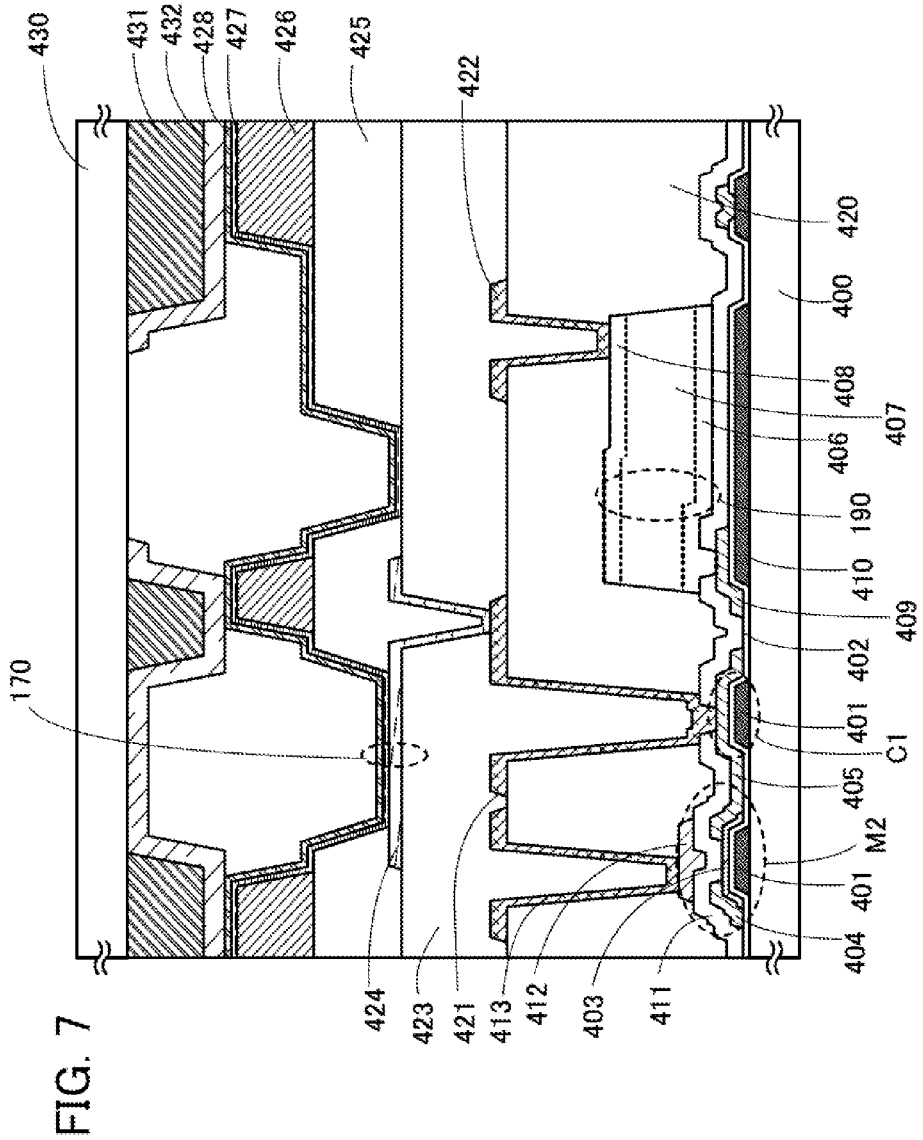
FIG. 7 is a cross-sectional view illustrating an example of a pixel unit.

FIG. 7 is an example of a cross-sectional view of the display region 12 of the display device 10. FIG. 7 illustrates the light-receiving element 190, the light-emitting element 170, the transistor M2, the capacitor C1, and the like in FIG. 2A.

The display device illustrated in FIG. 7 includes the transistor M2, the capacitor C1, and the light-receiving element 190 over a substrate 400.

The transistor M2 includes a conductive layer 401 which functions as a first gate, an insulating layer 402 over the conductive layer 401, a semiconductor layer 403 which overlaps with the conductive layer 401 with the insulating layer 402 positioned therebetween, a conductive layer 404 and a conductive layer 405 which are electrically connected to the semiconductor layer 403 and function as a source and a drain, an insulating layer 411 over the semiconductor layer 403, the conductive layer 404, and the conductive layer 405, and a conductive layer 412 which overlaps with the semiconductor layer 403 with the insulating layer 411 positioned therebetween and functions as a second gate.

The capacitor C1 includes the conductive layer 401 which functions as an electrode, the insulating layer 402 over the conductive layer 401, and the conductive layer 405 which overlaps with the conductive layer 401 with the insulating layer 402 positioned therebetween and functions as an electrode.

The light-receiving element 190 includes a p-type semiconductor layer 406, an i-type semiconductor layer 407, and an n-type semiconductor layer 408 which are sequentially stacked. A conductive layer 409 is connected to the p-type semiconductor layer 406 which functions as the anode of the light-receiving element 190. A conductive layer 410 which has a function of reflecting light having passed through the light-receiving element 190 is provided between the substrate 400 and the light-receiving element 190.

A diode element formed using a single crystal substrate with a pn junction or a pin junction may also be used as the light-receiving element 190. Alternatively, a pin diode element or the like formed using an amorphous silicon film, a microcrystalline silicon film, or the like may be used. Note that a photodiode is provided in the above example; however, another photoelectric conversion element may alternatively be used. For example, a diode-connected transistor may be used. Alternatively, a variable resistor or the like utilizing a photoelectric effect may be formed using silicon, germanium, selenium, or the like. Alternatively, a photodiode that includes selenium and utilizes avalanche multiplication may be used. Such a photodiode can be a highly sensitive light-receiving element in which the electronic amplification with respect to the amount of incident light is high.

The insulating layer 402 is provided over the conductive layer 410. The conductive layer 409 is provided over the insulating layer 402. The insulating layer 411 is provided over the conductive layer 409. The semiconductor layer 406 of the light-receiving element 190 is provided over the insulating layer 411. An opening is provided in the insulating layer 411, and the conductive layer 409 is connected to the semiconductor layer 406 through the opening.

An insulating layer 420 is provided over the transistor M2, the capacitor C1, and the light-receiving element 190, and a conductive layer 421, a conductive layer 422, and a conductive layer 413 are provided over the insulating layer 420. The conductive layer 421 is connected to the conductive layer 405 through an opening provided in the insulating layer 411 and the insulating layer 420. The conductive layer 422 is connected to the semiconductor layer 408 of the light-receiving element 190 through an opening provided in the insulating layer 420. The conductive layer 413 is connected to the conductive layer 412 of the transistor M2 through an opening provided in the insulating layer 420.

An insulating layer 423 is provided over the insulating layer 420, the conductive layer 421, the conductive layer 422, and the conductive layer 413, and a conductive layer 424 is provided over the insulating layer 423. The conductive layer 424 is connected to the conductive layer 421 through an opening provided in the insulating layer 423.

An insulating layer 425 is provided over the insulating layer 423 and the conductive layer 424. The insulating layer 425 has an opening that overlaps with the conductive layer 424 and an opening that overlaps with the light-receiving element 190. Over the insulating layer 425, an insulating layer 426 is provided in positions that are different from those of the openings of the insulating layer 425. An EL layer 427 and a conductive layer 428 are sequentially stacked over the insulating layer 425 and the insulating layer 426. A portion in which the conductive layer 424 and the conductive layer 428 overlap with each other with the EL layer 427 positioned therebetween functions as the light-emitting element 170. One of the conductive layers 424 and 428 functions as an anode, and the other thereof functions as a cathode.

The display device includes a substrate 430 which faces the substrate 400 with the light-emitting element 170 positioned therebetween. A light-blocking layer 431 that has a function of blocking light is provided on a surface of the substrate 430 which faces the substrate 400. The light-blocking layer 431 has an opening that overlaps with the light-emitting element 170 and an opening that overlaps with the light-receiving element 190. In the opening that overlaps with the light-emitting element 170, a coloring layer 432 which transmits visible light in a specific wavelength range is provided on the surface of the substrate 430 which faces the substrate 400. To increase the intensity of light that passes through the substrate 430 and enters the light-receiving element 190, the coloring layer 432 is preferably provided in a position that does not overlap with the light-receiving element 190.

For the substrate 400 and the substrate 430, glass, quartz, ceramic, sapphire, an organic resin, or the like can be used. When the substrate 400 and the substrate 430 are formed using a flexible material, the flexibility of the display device can be increased.

The light-emitting element 170 has a top emission structure, a bottom emission structure, a dual emission structure, or the like. A conductive film that transmits visible light is used for an electrode through which light is extracted. A conductive film that reflects visible light is preferably used for an electrode through which light is not extracted.

The EL layer 427 includes at least a light-emitting layer. In addition to the light-emitting layer, the EL layer 427 may further include a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like.

The EL layer 427 can be formed using either a low-molecular compound or a high-molecular compound and may contain an inorganic compound. Each of the layers included in the EL layer 427 can be formed by an evaporation method (including a vacuum evaporation method), a transfer method, a printing method, an inkjet method, a coating method, or the like.

The EL layer 427 may contain an inorganic compound such as quantum dots. Quantum dots used for the light-emitting layer can function as light-emitting materials, for example.

As materials for a gate, a source, and a drain of a transistor, and a conductive layer such as a wiring or an electrode included in the display device, metals such as aluminum, titanium, chromium, nickel, copper, yttrium, zirconium, molybdenum, silver, tantalum, and tungsten, an alloy containing any of the metals as its main component, and the like can be given. A single-layer or stacked-layer structure including a film containing any of these materials can be used.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Alternatively, a nitride of the metal material (e.g., titanium nitride) or the like may be used. In the case of using a metal material or an alloy material (or a nitride thereof), the thickness is set small enough to transmit light. Alternatively, a stack of films of any of the above materials can be used as the conductive layer. For example, a stack of a silver-magnesium alloy film and an indium tin oxide film is preferably used because the conductivity can be increased. Such materials can also be used for conductive layers such as a variety of wirings and electrodes included in the display device and conductive layers (e.g., conductive layers functioning as a pixel electrode and a common electrode) included in the display element.

Examples of an insulating material that can be used for the insulating layers include resins such as acrylic and an epoxy resin and inorganic insulating materials such as silicon oxide, silicon oxynitride, silicon nitride oxide, silicon nitride, and aluminum oxide.

Examples of a material that can be used for the coloring layer include a metal material, a resin material, and a resin material containing a pigment or dye.

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stack of films containing materials of coloring layers can also be used as the light-blocking layer. For example, a stacked-layer structure of a film containing a material of a coloring layer that transmits light of a color and a film containing a material of a coloring layer that transmits light of another color can be employed. The coloring layers and the light-blocking layer are preferably formed using the same materials because the same manufacturing apparatus can be used and the process can be simplified.

As described above, the display device of this embodiment can perform display that is most suitable for the usage environment by detecting the amount of light delivered to the light-receiving element. Accordingly, a display device with low power consumption can be provided. Moreover, a display device having high visibility regardless of the ambient brightness can be provided. Furthermore, an unnecessary change in the gray level of the display element does not occur in photodetection; thus, the display quality can be improved.

This embodiment can be combined with any of the other embodiments as appropriate. In the case where a plurality of structure examples are described in one embodiment in this specification, the structure examples can be combined as appropriate.

Embodiment 2

In this embodiment, a display device of one embodiment of the present invention will be described with reference to FIG. 8, FIGS. 9A to 9C, FIGS. 10A to 10C, FIGS. 11A to 11C, FIGS. 12A and 12B1 to 12B4, FIG. 13, FIG. 14, FIG. 15, FIG. 16, FIGS. 17A and 17B, and FIG. 18.

The display device of this embodiment includes a light-receiving element, a first display element that reflects visible light, and a second display element that emits visible light. The display device has a function of changing the gray level of the second display element in accordance with the amount of light detected by the light-receiving element.

The display device of this embodiment has a function of displaying an image by using light reflected from the first display element and/or light emitted from the second display element.

Specifically, the display device of this embodiment has a first mode in which an image is displayed using only the first display element, a second mode in which an image is displayed using only the second display element, and a third mode in which an image is displayed using both the first display element and the second display element. These modes can be automatically or manually switched.

In the first mode, an image is displayed using the first display element and external light. The first mode does not require a light source and is therefore an extremely low-power mode. For example, when sufficient external light enters the display device (e.g., in a bright environment), an image can be displayed using light reflected from the first display element. The first mode is effective in the case where external light is sufficiently intense, white or near white light, for example. The first mode is suitable for displaying text information. Furthermore, the use of reflected external light enables eye-friendly display in the first mode, which leads to an effect of reducing eyestrain.

In the second mode, an image is displayed using light emitted from the second display element. Thus, an extremely vivid image (with high contrast and excellent color reproducibility) can be displayed regardless of the illuminance and the chromaticity of external light. The second mode is effective under extremely low illuminance, such as during nighttime or in a dark room, for example. When a bright image is displayed in dark surroundings, a user may feel that the image is too bright. To prevent this, an image with reduced luminance is preferably displayed in the second mode. Consequently, glare can be suppressed, and power consumption can be reduced. The second mode is suitable for displaying a vivid (still and moving) image or the like.

In the third mode, an image is displayed using both light reflected from the first display element and light emitted from the second display element. In the third mode, a more vivid image can be displayed than in the first mode, and the power consumption can be lower than in the second mode. The third mode is effective under relatively low illuminance or in the case where the chromaticity of external light is not white, for example, under indoor illumination or in the morning or in the evening.

With such a structure, an all-weather display device or a convenient display device having high visibility regardless of the ambient brightness can be provided.

In one embodiment of the present invention, especially in the second mode, the amount of light delivered to the light-receiving element is detected, and the gray level of the second display element is changed in accordance with the amount of detected light; thus, an image can be displayed with a brightness suitable for the usage environment. As the surroundings of the display device become darker, the gray level of the second display element is reduced, whereby the power consumption can be reduced. In the case where the display device is placed in bright surroundings, the gray level of the second display element is increased, whereby the visibility can be improved. Consequently, a user can always see a displayed image or the like with optimum luminance regardless of the environment where the display device of this embodiment is used. In the third mode, as in the second mode, the amount of light delivered to the light-receiving element may be detected and the gray level of the second display element may be changed in accordance with the amount of detected light.

In another embodiment of the present invention, especially in the third mode, the amount of light delivered to the light-receiving element is detected, and the gray level of the second display element is changed in accordance with the amount of detected light; thus, an image can be displayed with a brightness suitable for the usage environment.

Photocurrent can flow in a direction reverse to that in the circuit configuration described as an example in Embodiment 1 (e.g., FIG. 2A), when the potential $V_{VPD}$ and the potential $V_{VPR}$ have a reverse magnitude relation and the cathode and the anode of the light-receiving element 190 are reversed. That is, the smaller the amount of light to which the light-receiving element is exposed is, the higher the potentials of the node FD and the node FD2 become; the larger the amount of light to which the light-receiving element is exposed is, the lower the potentials of the node FD and the node FD2 become.

Such a configuration enables, in the third mode, the gray level of the second display element to be increased as the surroundings of the display device become darker, whereby the visibility can be improved. In the third mode, as the surroundings of the display device become brighter, the first display element contributes more to the display; therefore, the gray level of the second display element can be lowered to reduce power consumption. Furthermore, in the third mode, the gray level of the second display element is preferably changed such that the total brightness of light reflected from the first display element and light emitted from the second display element is constant.

As described above, the circuit configuration is preferably determined in accordance with the content to be processed. For the display device of this embodiment, image processing using a processor or the like is unnecessary; the display device itself can execute such a gray-level conversion process.

As the first display element, an element which displays an image by reflecting external light can be used. Such an element does not include a light source (or does not require an artificial light source); thus, power consumption for display can be significantly reduced.

As the first display element, a reflective liquid crystal element can typically be used. Alternatively, as the first display element, an element using a microcapsule method, an electrophoretic method, an electrowetting method, an Electronic Liquid Powder (registered trademark) method, or the like as well as micro electro mechanical systems (MEMS) shutter element or an optical interference type MEMS element can be used.

As the second display element, a light-emitting element is preferably used. Since the luminance and the chromaticity of light emitted from such a display element are not affected by external light, a vivid image with high color reproducibility (a wide color gamut) and a high contrast can be displayed.

As the second display element, a self-luminous light-emitting element such as an organic light-emitting diode (OLED), a light-emitting diode (LED), or a quantum-dot light-emitting diode (QLED) can be used.

Figure 8:
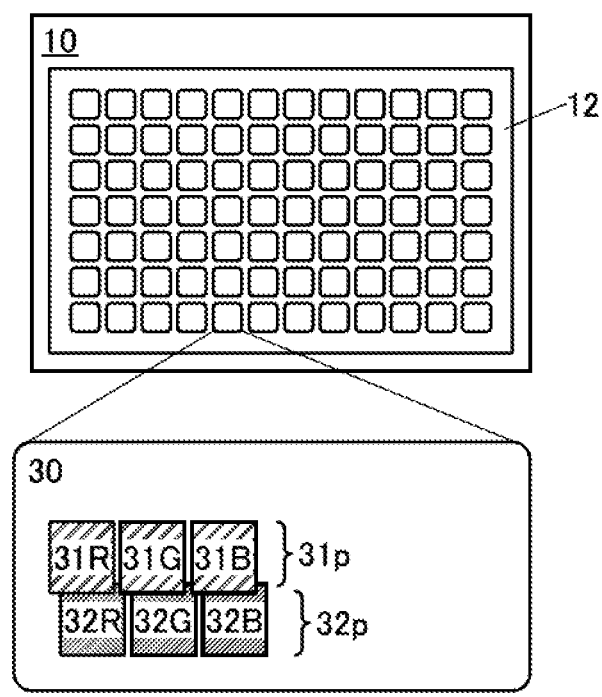
FIG. 8 is a block diagram illustrating an example of a display device.

FIG. 8 is a block diagram of the display device 10. The display device 10 includes the display region 12.

The display region 12 includes a plurality of pixel units 30 arranged in a matrix. The pixel units 30 each include a first pixel 31p and a second pixel 32p.

FIG. 8 illustrates an example in which the first pixel 31p and the second pixel 32p each include display elements for three colors of red (R), green (G), and blue (B).

The display elements included in the first pixel 31p are each a display element that utilizes reflection of external light. The first pixel 31p includes a first display element 31R for red (R), a first display element 31G for green (G), and a first display element 31B for blue (B).

The display elements included in the second pixel 32p are each a light-emitting element. The second pixel 32p includes a second display element 32R for red (R), a second display element 32G for green (G), and a second display element 32B for blue (B).

Figure 9A:
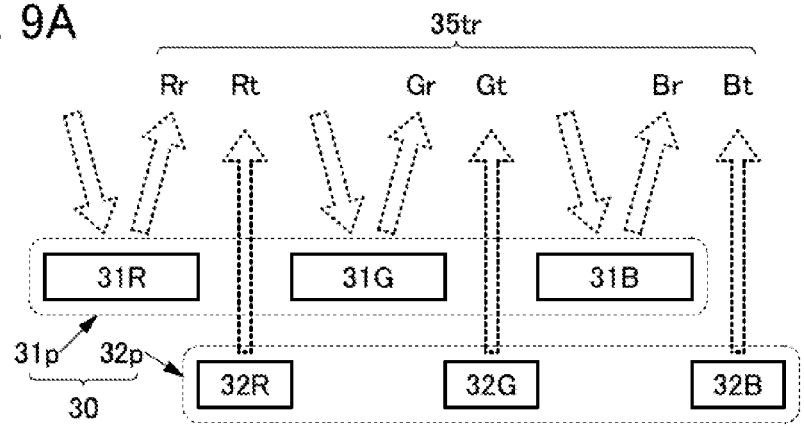
FIGS. 9A to 9C illustrate examples of a pixel unit.
Figure 9B:
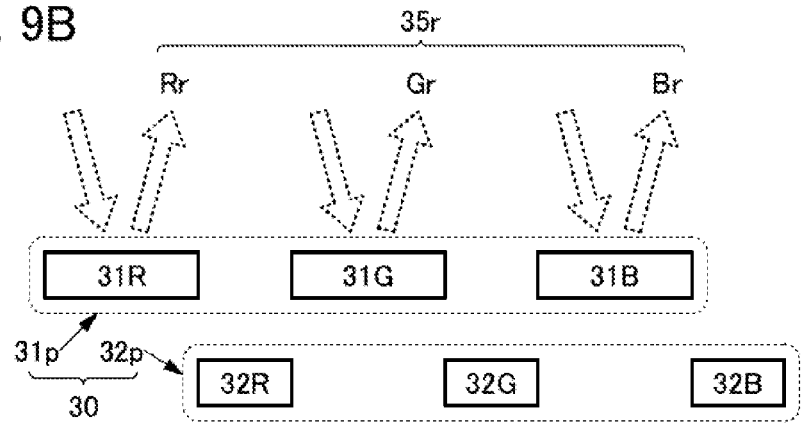
Figure 9C:
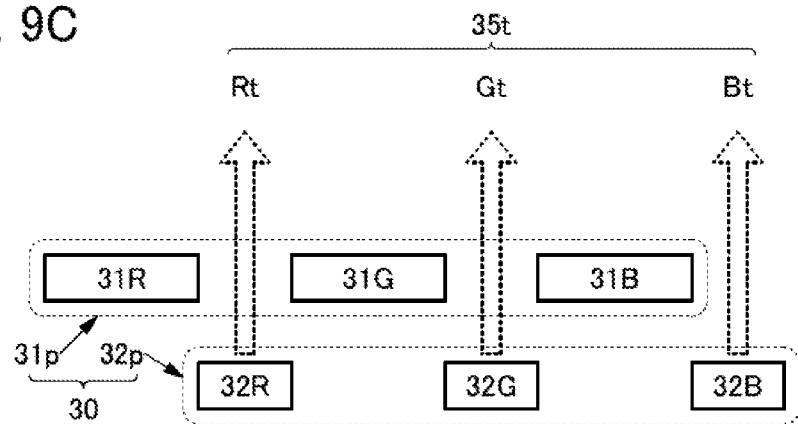

FIGS. 9A to 9C schematically illustrate configuration examples of the pixel unit 30.

The first pixel 31p includes the first display element 31R, the first display element 31G, and the first display element 31B. The first display element 31R reflects external light, which is then extracted as red light Rr to the display surface side. Similarly, green light Gr and blue light Br are extracted from the first display element 31G and the first display element 31B, respectively, to the display surface side.

The second pixel 32p includes the second display element 32R, the second display element 32G, and the second display element 32B. The second display element 32R emits red light Rt to the display surface side. Similarly, the second display element 32G and the second display element 32B emit green light Gt and blue light Bt, respectively, to the display surface side.

FIG. 9A corresponds to a display mode (third mode) in which both the first pixel 31p and the second pixel 32p are driven. The pixel unit 30 can emit light 35tr of a predetermined color to the display surface side with the use of the reflected light (the light Rr, the light Gr, and the light Br) and the transmitted light (the light Rt, the light Gt, and the light Bt).

FIG. 9B corresponds to a display mode (first mode) using reflected light, in which only the first pixel 31p is driven. For example, when the intensity of external light is sufficiently high, the pixel unit 30 can emit light 35r to the display surface side with the use of only the light from the first pixel 31p (the light Rr, the light Gr, and the light Br), without driving the second pixel 32p. This enables extremely low-power driving.

FIG. 9C corresponds to a display mode (second mode) using emitted light (transmitted light), in which only the second pixel 32p is driven. For example, when the intensity of external light is extremely low, the pixel unit 30 can emit light 35t to the display surface side with the use of only the light from the second pixel 32p (the light Rt, the light Gt, and the light Bt), without driving the first pixel 31p. Thus, a vivid image can be displayed. Furthermore, the luminance is lowered in dark surroundings, which can prevent a user from feeling glare and reduce power consumption.

There is no limitation on the color and number of display elements included in the first pixel 31p and the second pixel 32p.

FIGS. 10A to 10C and FIGS. 11A to 11C each illustrate a configuration example of the pixel unit 30. Although these schematic views correspond to the display mode (third mode) in which both the first pixel 31p and the second pixel 32p are driven, the display mode (first mode or second mode) in which only the first pixel 31p or the second pixel 32p is driven can also be used in a manner similar to that described above.

Figure 10A:
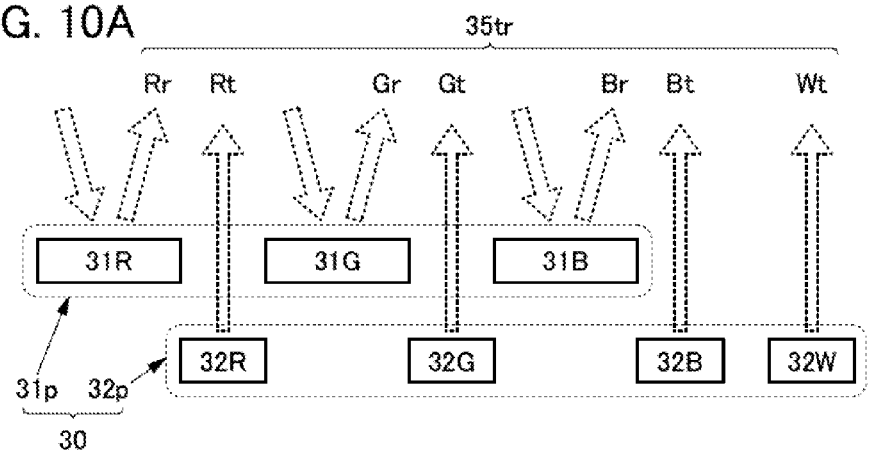
FIGS. 10A to 10C illustrate examples of a pixel unit.
Figure 10B:
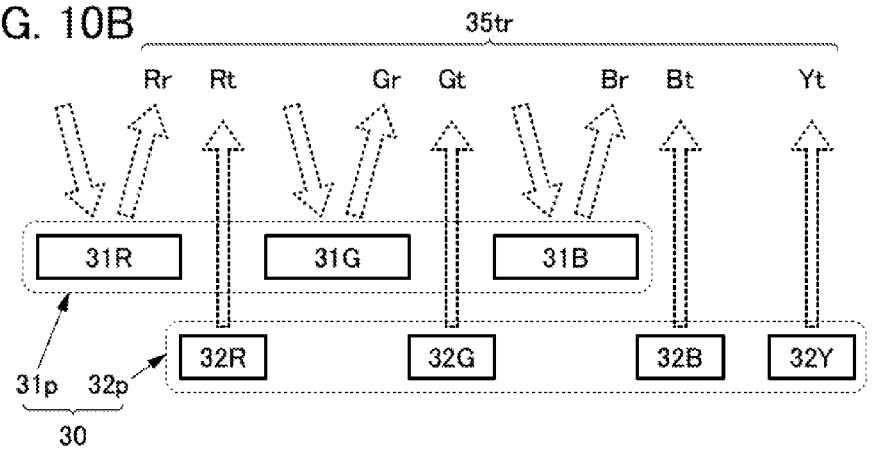
Figure 10C:
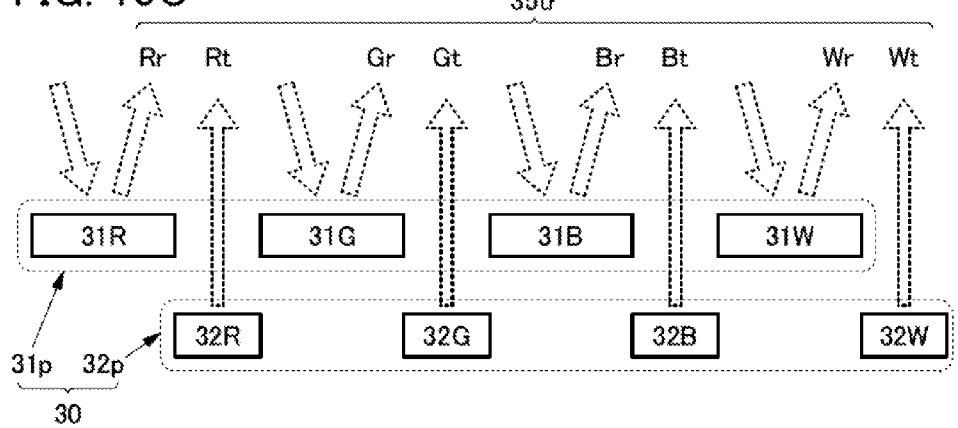
Figure 11A:
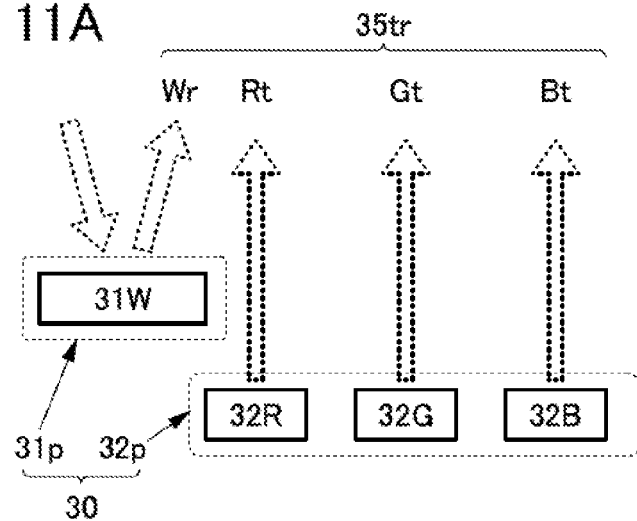
FIGS. 11A to 11C illustrate examples of a pixel unit.
Figure 11B:
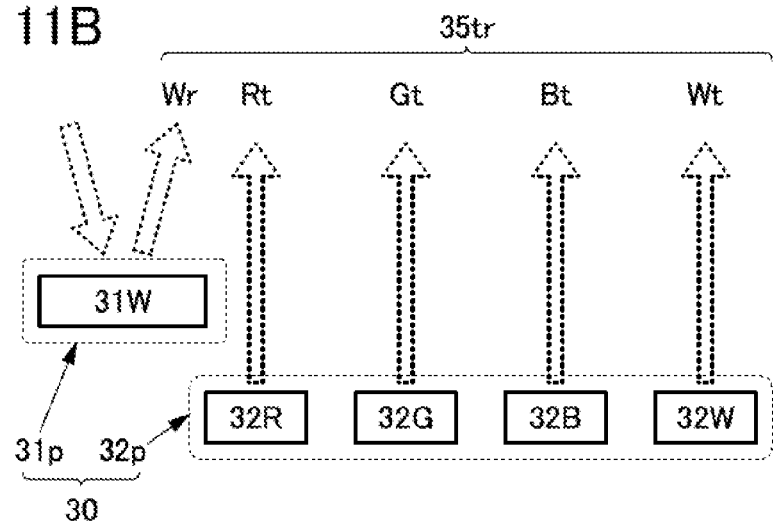

The second pixel 32p illustrated in FIGS. 10A and 10C and FIG. 11B includes a second display element 32W that exhibits white (W) in addition to the second display element 32R, the second display element 32G, and the second display element 32B.

Figure 11C:
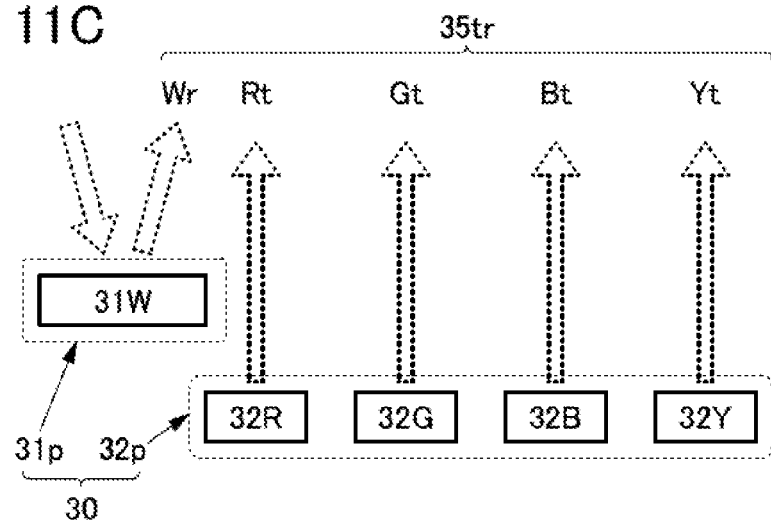

The second pixel 32p illustrated in FIG. 10B and FIG. 11C includes a second display element 32Y that exhibits yellow (Y) in addition to the second display element 32R, the second display element 32G, and the second display element 32B.

The power consumption in the display mode using the second pixel 32p (second mode and third mode) can be lower in the configurations illustrated in FIGS. 10A to 10C and FIGS. 11B and 11C than in a configuration including neither the second display element 32W nor the second display element 32Y.

The first pixel 31p illustrated in FIG. 10C includes a first display element 31W that exhibits white (W) in addition to the first display element 31R, the first display element 31G, and the first display element 31B.

The power consumption in the display mode using the first pixel 31p (first mode and third mode) can be lower in the configuration illustrated in FIG. 10C than in the configuration illustrated in FIG. 9A.

The first pixel 31p illustrated in FIGS. 11A to 11C includes only the first display element 31W that exhibits white (W). In this case, in the display mode using only the first pixel 31p (first mode), a monochrome or grayscale image can be displayed; in the display modes using the second pixel 32p (second mode and third mode), a color image can be displayed.

Such a configuration can increase the aperture ratio and the reflectivity of the first pixel 31p, allowing a brighter image to be displayed.

The first mode is suitable for displaying information that need not be displayed in color, such as text information.

Configuration Example 2 of Display Device

FIG. 12A is a block diagram of a display device 450. The display device 450 includes a display portion 362, a circuit GD, and a circuit SD. The display portion 362 includes a plurality of pixel units 460 arranged in a matrix.

The display device 450 includes a plurality of wirings GL_L, a plurality of wirings GL_E, a plurality of wirings ANODE, a plurality of wirings CSCOM, a plurality of wirings SL_L, and a plurality of wirings SL_E. The plurality of wirings GL_L, the plurality of wirings GL_E, the plurality of wirings ANODE, and the plurality of wirings CSCOM are each electrically connected to the circuit GD and the plurality of pixel units 460 arranged in the direction of an arrow R. The plurality of wirings SL_L and the plurality of wirings SL_E are each electrically connected to the circuit SD and the plurality of pixel units 460 arranged in the direction of an arrow C.

Although the configuration including one circuit GD and one circuit SD is illustrated here for simplicity, the circuit GD and the circuit SD for driving a liquid crystal element and those for driving a light-emitting element may be provided separately.

The pixel unit 460 includes a reflective liquid crystal element and a light-emitting element.

FIGS. 12B1 to 12B4 illustrate configuration examples of a conductive layer 311b included in the pixel unit 460. The conductive layer 311b functions as a reflective electrode of the liquid crystal element. In FIGS. 12B1, 12B2, and 12B4, the conductive layer 311b has an opening 451.

Dashed lines in FIGS. 12B1 and 12B2 each denote the light-emitting element 170 positioned in a region overlapping with the conductive layer 311b. The light-emitting element 170 overlaps with the opening 451 of the conductive layer 311b. Thus, light is emitted from the light-emitting element 170 to the display surface side through the opening 451.

In FIG. 12B1, the pixel units 460 adjacent in the direction of the arrow R are pixels for different colors. As illustrated in FIG. 12B1, the openings 451 are preferably provided in different positions in the conductive layers 311b so as not to be aligned in the two pixels adjacent in the direction of the arrow R. This allows the two light-emitting elements 170 to be apart from each other, thereby preventing light emitted from the light-emitting element 170 from entering a coloring layer in the adjacent pixel unit 460 (such a phenomenon is also referred to as crosstalk). Furthermore, since the two adjacent light-emitting elements 170 can be arranged apart from each other, a high-resolution display device can be obtained even when EL layers of the light-emitting elements 170 are separately formed with a shadow mask or the like.

In FIG. 12B2, the pixel units 460 adjacent in the direction of the arrow C are pixels for different colors. Also in FIG. 12B2, the openings 451 are preferably provided in different positions in the conductive layers 311b so as not to be aligned in the two pixels adjacent in the direction of the arrow C.

As the ratio of the total area of the opening 451 to the total area except for the opening becomes smaller, an image displayed using the liquid crystal element can become brighter. Furthermore, as the ratio of the total area of the opening 451 to the total area except for the opening becomes larger, an image displayed using the light-emitting element 170 can become brighter.

Furthermore, as the area of the opening 451 of the conductive layer 311b functioning as a reflective electrode becomes larger, the extraction efficiency of light emitted from the light-emitting element 170 can be increased.

The opening 451 can have a polygonal shape, a quadrangular shape, an elliptical shape, a circular shape, a cross shape, a stripe shape, a slit shape, or a checkered pattern, for example. The opening 451 may be provided close to the adjacent pixel. Preferably, the opening 451 is provided close to another pixel displaying the same color, in which case crosstalk can be suppressed.

As illustrated in FIG. 12B3, a light-emitting region of the light-emitting element 170 may be positioned in a region in which the conductive layer 311b is not provided, in which case light emitted from the light-emitting element 170 is emitted to the display surface side.

The pixel unit 460 illustrated in FIG. 12B4 includes a light-emitting element 170w overlapping with the opening of the conductive layer 311b and a light-emitting element 170r, a light-emitting element 170g, and a light-emitting element 170b which are arranged around the conductive layer 311b. It is preferable that the light-emitting element 170r, the light-emitting element 170g, and the light-emitting element 170b have substantially the same light-emitting area.

FIGS. 12B1 to 12B4 each illustrate an example in which the light-receiving element 190 is positioned in a region in which the conductive layer 311b is not provided.

As the circuit GD, for example, a variety of sequential circuits such as a shift register can be used. A transistor, a capacitor, and the like can be used for the circuit GD. The transistor included in the circuit GD can be formed through the same process as transistors included in the pixel units 460.

The circuit SD is electrically connected to the wirings SL_L. For example, an integrated circuit can be used as the circuit SD. Specifically, an integrated circuit formed on a silicon substrate can be used as the circuit SD.

For example, a chip on glass (COG) method, a chip on film (COF) method, or the like can be used to mount the circuit SD on a pad electrically connected to the pixel units 460. Specifically, an anisotropic conductive film can be used to mount the integrated circuit on the pad.

FIG. 13, FIG. 14, FIG. 15, and FIG. 16 each illustrate an example of a circuit diagram of the pixel unit 460.

Configuration Example 2 of Pixel Unit

Figure 13:
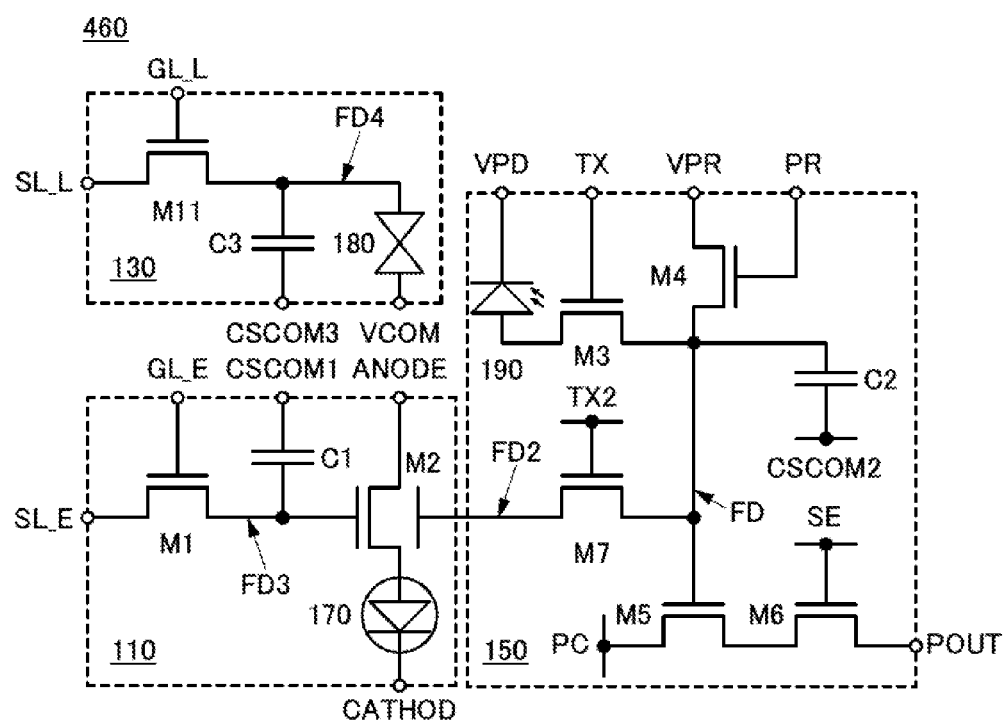
FIG. 13 is a circuit diagram illustrating an example of a pixel unit.

FIG. 13 is a circuit diagram illustrating the photodetector circuit 150, the pixel circuit 110, and the pixel circuit 130 included in the pixel unit 460.

In the pixel unit 460, the photodetector circuit 150 and the pixel circuit 110 are electrically connected to each other. The pixel circuit 110 includes the light-emitting element 170. The pixel circuit 130 includes a liquid crystal element.

The photodetector circuit 150 and the pixel circuit 110 have configurations similar to those in FIG. 2A; in this regard, refer to the description in Embodiment 1.

The pixel circuit 130 includes the liquid crystal element 180, the transistor M11, and the capacitor C3. The transistor M11 includes one gate.

The first electrode of the liquid crystal element 180 is electrically connected to the one of the source and the drain of the transistor M11 and the one electrode of the capacitor C3. The second electrode of the liquid crystal element 180 is electrically connected to the wiring VCOM. The first electrode and the second electrode of the liquid crystal element 180 function as a pixel electrode and a common electrode, respectively.

Here, the node where the first electrode of the liquid crystal element 180, the one of the source and the drain of the transistor M11, and the one electrode of the capacitor C3 are connected to each other is referred to as the node FD4.

The gate of the transistor M11 is electrically connected to the wiring GL_L. The other of the source and the drain of the transistor M11 is electrically connected to the wiring SL_L.

The other electrode of the capacitor C3 is electrically connected to the wiring CSCOM3.

The wiring GL_E and the wiring GL_L are each supplied with a signal from the circuit GD. The wiring SL_E and the wiring SL_L are each supplied with a signal from the circuit SD. For example, the wiring GL_E and the wiring GL_L are each supplied with a scan signal, and the wiring SL_E and the wiring SL_L are each supplied with a video signal. The wiring VCOM and the wiring CSCOM3 are each supplied with a predetermined potential.

The conduction state of the transistor M11 is controlled by the wiring GL_L. When the transistor M11 is on, an analog value corresponding to video data input from the wiring SL_L is stored at the node FD4. The capacitor C3 has a function of retaining a charge of the node FD4. The alignment of liquid crystal is controlled by the voltage between the node FD4 and the wiring VCOM, whereby the luminance of light extracted through the liquid crystal element 180 is changed. The gray level of the liquid crystal element 180 can be controlled in this manner.

The pixel unit 460 illustrated in FIG. 13 can display an image in the first mode by being driven with the signals supplied to the wiring GL_L and the wiring SL_L and by utilizing the optical modulation of the liquid crystal element 180. Furthermore, an image can be displayed in the second mode by driving the pixel unit with the signals supplied to the wiring GL_E and the wiring SL_E and making the light-emitting element 170 emit light. In the case where the two modes are combined, the pixel unit can be driven with the signals supplied to the wiring GL_L, the wiring GL_E, the wiring SL_L, and the wiring SL_E.

The driving method of a pixel unit described in Embodiment 1 can be applied to the pixel unit 460 illustrated in FIG. 13. That is, the emission intensity of the light-emitting element 170 can be changed using the photodetector circuit 150. Specifically, as in Example 1 of Driving Method, the gray level of the light-emitting element 170 is changed in accordance with the amount of detected light, whereby an image can be displayed with a brightness suitable for the usage environment. Alternatively, as in Example 2 of Driving Method, the gray level of the light-emitting element 170 can be set to a desired value.

In the case where a transistor including an oxide semiconductor in a channel formation region and having extremely low off-state current is used as the transistor M11 or in the case where a memory element electrically connected to the transistor M11 is used, for example, the gray level of a still image displayed using the liquid crystal element 180 can be maintained even when a write operation to the pixel is stopped. That is, the displayed image can be maintained even when the frame rate is set to an extremely small value. In one embodiment of the present invention, the frame rate can be extremely low and low-power driving can be performed.

In the example illustrated in FIG. 13, one pixel unit 460 includes one liquid crystal element 180, one light-emitting element 170, and one light-receiving element 190; however, the configuration is not limited thereto.

Figure 14:
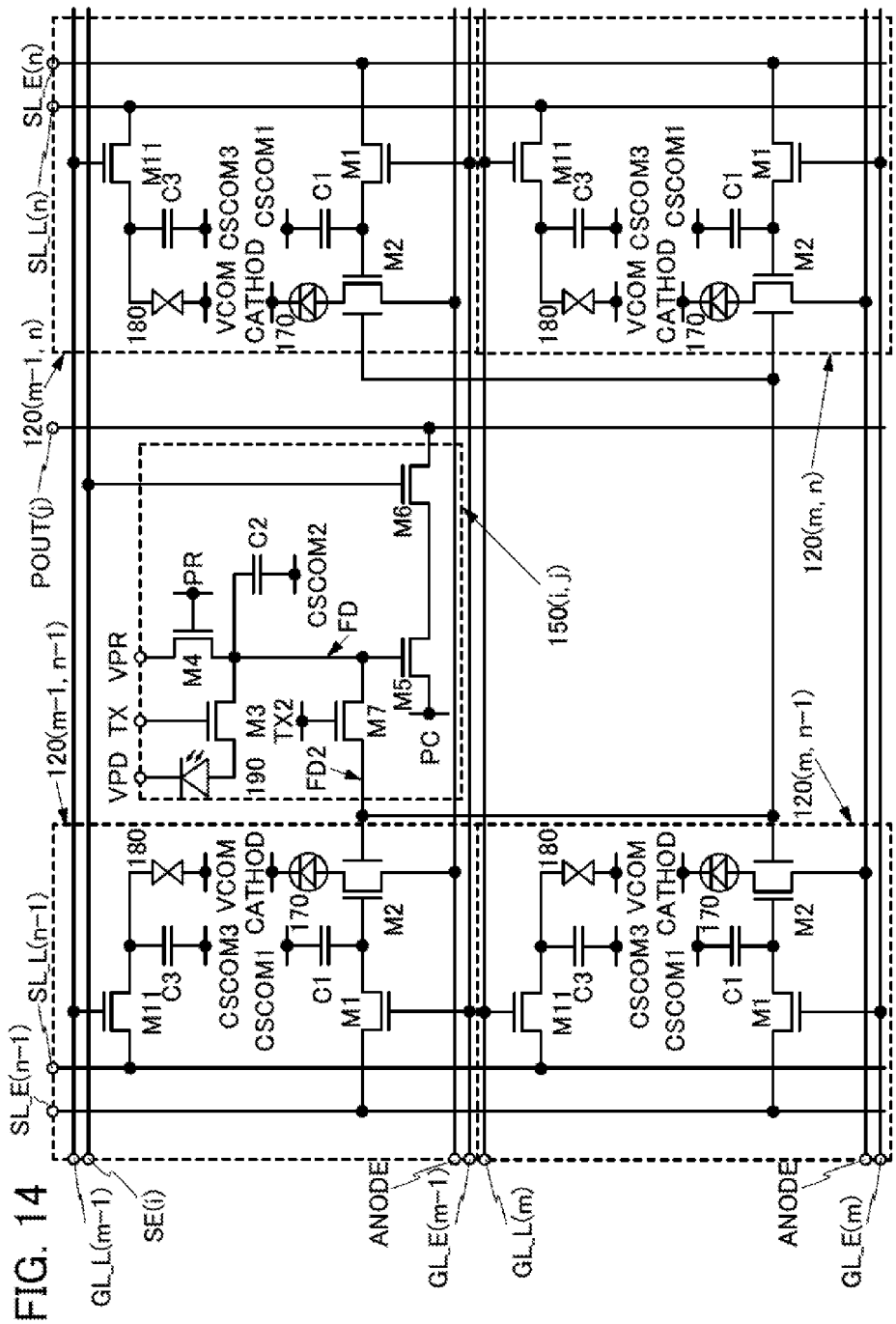
FIG. 14 is a circuit diagram illustrating an example of a pixel unit.
Figure 15:
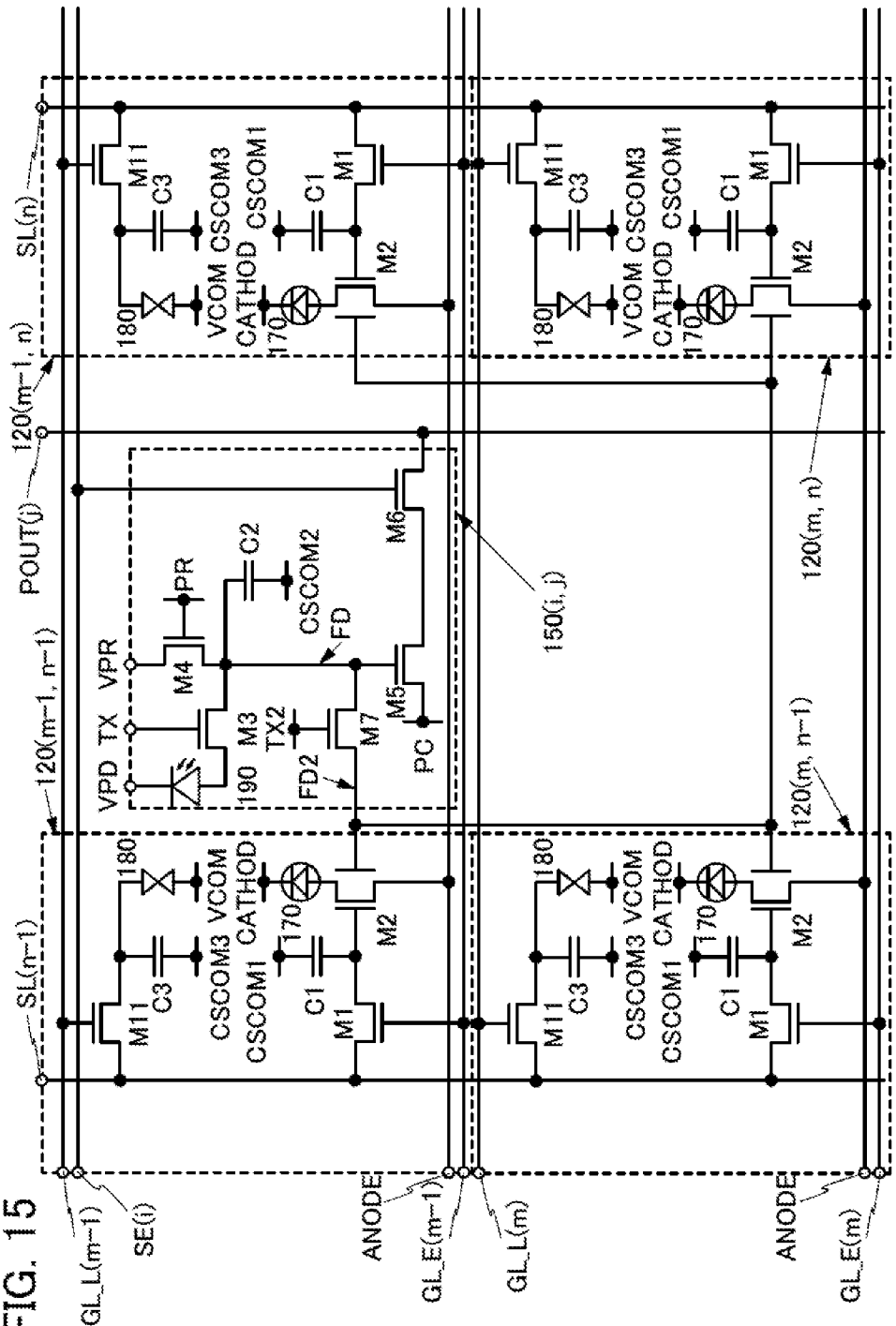
FIG. 15 is a circuit diagram illustrating an example of a pixel unit.

FIG. 14 and FIG. 15 each illustrate an example in which for one photodetector circuit 150, four pixel circuits 120 are provided. Each pixel circuit 120 includes one liquid crystal element 180 and one light-emitting element 170.

The pixel circuit 120 in FIG. 14 has a configuration in which the pixel circuit 110 and the pixel circuit 130 in FIG. 13 are combined; detailed description thereof is omitted.

In FIG. 14, the plurality of pixel circuits 120 is arranged in a matrix of m rows and n columns (m and n are each an integer of 2 or more).

The pixel circuits 120 in the m−1-th row are electrically connected to the wiring GL_E(m−1), and the pixel circuits 120 in the m-th row are electrically connected to the wiring GL_E(m).

The pixel circuits 120 in the m−1-th row are electrically connected to a wiring GL_L(m−1), and the pixel circuits 120 in the m-th row are electrically connected to a wiring GL_L(m).

The pixel circuits 120 in the n−1-th column are electrically connected to the wiring SL_E(n−1), and the pixel circuits 120 in the n-th column are electrically connected to the wiring SL_E(n).

The pixel circuits 120 in the n−1-th column are electrically connected to a wiring SL_L(n−1), and the pixel circuits 120 in the n-th column are electrically connected to a wiring SL_L(n).

The photodetector circuit 150(i,j) (i and j are each an integer of 1 or more) is electrically connected to the wiring SE(i) and the wiring POUT(j).

The configuration of the pixel circuit 120 in FIG. 15 is different from the configuration in FIG. 14 in that the wiring SL is shared by the source or the drain of the transistor M1 and the source or the drain of the transistor M11. Except for this, the configuration in FIG. 15 is the same as that in FIG. 14.

In FIG. 15, the pixel circuits 120 in the n−1-th column are electrically connected to the wiring SL(n−1), and the pixel circuits 120 in the n-th column are electrically connected to the wiring SL(n).

In FIG. 14 and FIG. 15, the node FD2 is connected to the second gates of the transistors M2 of the four pixel circuits 120. In accordance with a change in the potential of the node FD2 in the photodetector circuit 150, the luminances of the light-emitting elements 170 included in the four pixel circuits 120 can be changed at the same time.

Figure 16:
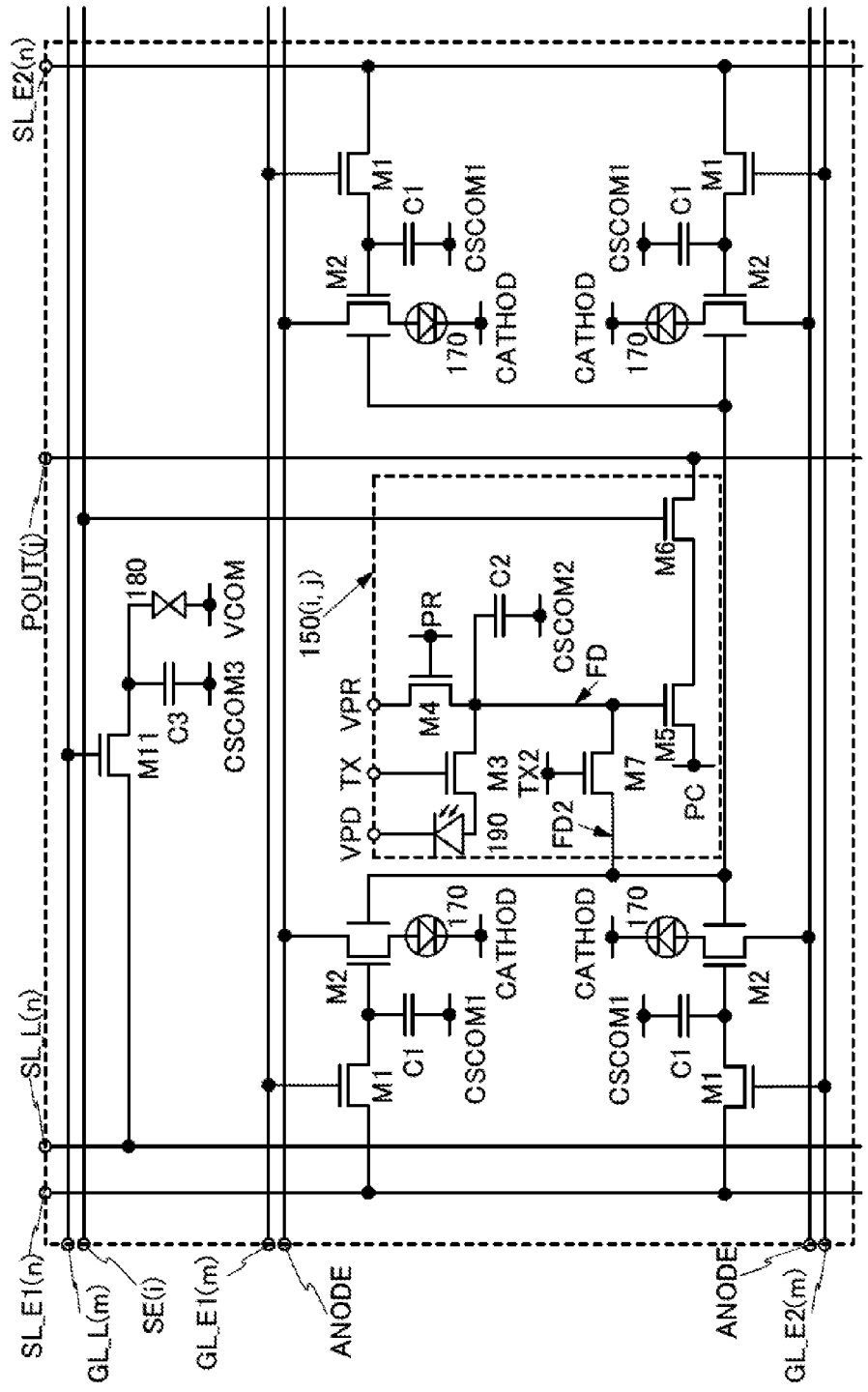
FIG. 16 is a circuit diagram illustrating an example of a pixel unit.

FIG. 16 illustrates an example for one photodetector circuit 150, one liquid crystal element 180 and four light-emitting elements 170 are provided. The pixel unit 460 illustrated in FIG. 16 differs from that in FIG. 13, FIG. 14, and FIG. 15 in being capable of full-color display by one pixel with the light-emitting elements.

In FIG. 16, instead of the wiring GL_E and the wiring SL_E in FIG. 13, a wiring GL_E1, a wiring GL_E2, a wiring SL_E1, and a wiring SL_E2 are connected to the pixel unit 460.

In FIG. 16, for example, light-emitting elements that exhibit red (R), green (G), blue (B), and white (W) can be used as the four light-emitting elements 170. Furthermore, as the liquid crystal element 180, a reflective liquid crystal element that exhibits white can be used. Thus, in the first mode, white with high reflectivity can be displayed. In the second mode, an image with a high color rendering property can be displayed with low power consumption.

Figure 17A:
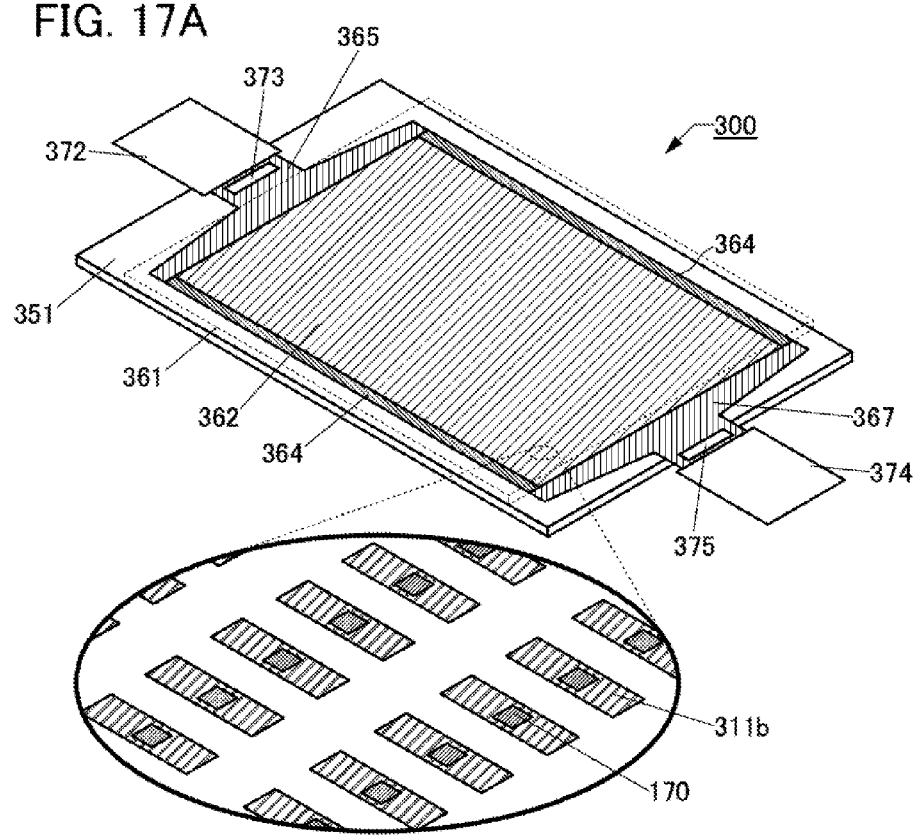
FIGS. 17A and 17B are perspective views illustrating an example of a display device.
Figure 17B:
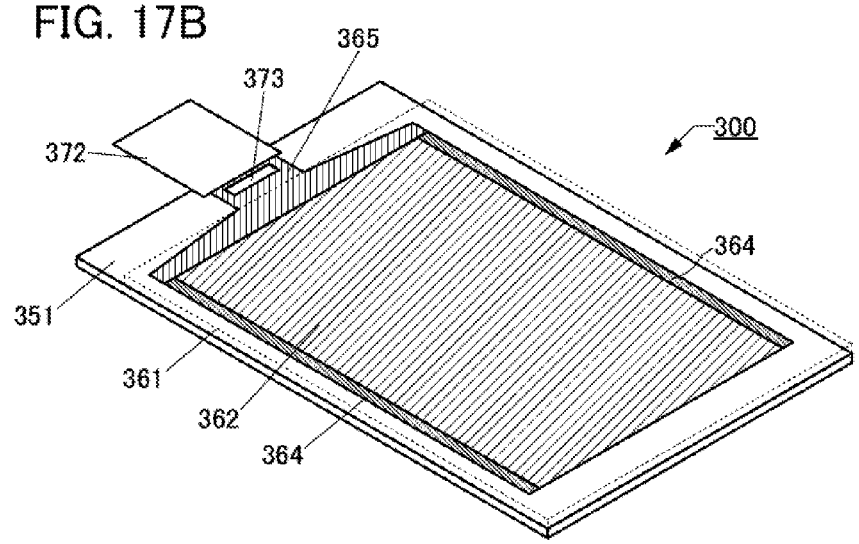

FIGS. 17A and 17B are schematic perspective views of a display device 300. In the display device 300, a substrate 351 and a substrate 361 are attached to each other. In FIGS. 17A and 17B, the substrate 361 is denoted by dashed lines.

The display device 300 includes a display portion 362, a circuit 364, a wiring 365, a wiring 367, and the like. For example, the substrate 351 is provided with the circuit 364, the wiring 365, the wiring 367, and the conductive layer 311*b* functioning as a pixel electrode. In the example illustrated in FIG. 17A, an IC 373, an FPC 372, an IC 375, and an FPC 374 are mounted on the substrate 351. In the example illustrated in FIG. 17B, the IC 373 and the FPC 372 are mounted on the substrate 351. Thus, the structures illustrated in FIGS. 17A and 17B can each be regarded as a display module including the display device 300, the IC, and the FPC.

As the circuit 364, for example, a scan line driver circuit can be used.

The wiring 365 has a function of supplying signals and power to the display portion 362 and the circuit 364. The signals and power are input to the wiring 365 from the outside through the FPC 372 or from the IC 373.

An IC including a scan line driver circuit, a signal line driver circuit, or the like can be used as each of the ICs 373 and 375, for example. Note that the display device 300 and the display module are not necessarily provided with an IC. The IC may be mounted on the FPC by a COF method or the like.

FIG. 17A illustrates an enlarged view of part of the display portion 362. The conductive layers 311*b* included in a plurality of display elements are arranged in a matrix in the display portion 362. The conductive layer 311*b* has a function of reflecting visible light and serves as a reflective electrode of the liquid crystal element 180.

As illustrated in FIG. 17A, the conductive layer 311*b* has an opening. The light-emitting element 170 is positioned closer to the substrate 351 than the conductive layer 311*b*. Light is emitted from the light-emitting element 170 to the substrate 361 side through the opening of the conductive layer 311*b*.

Figure 18:
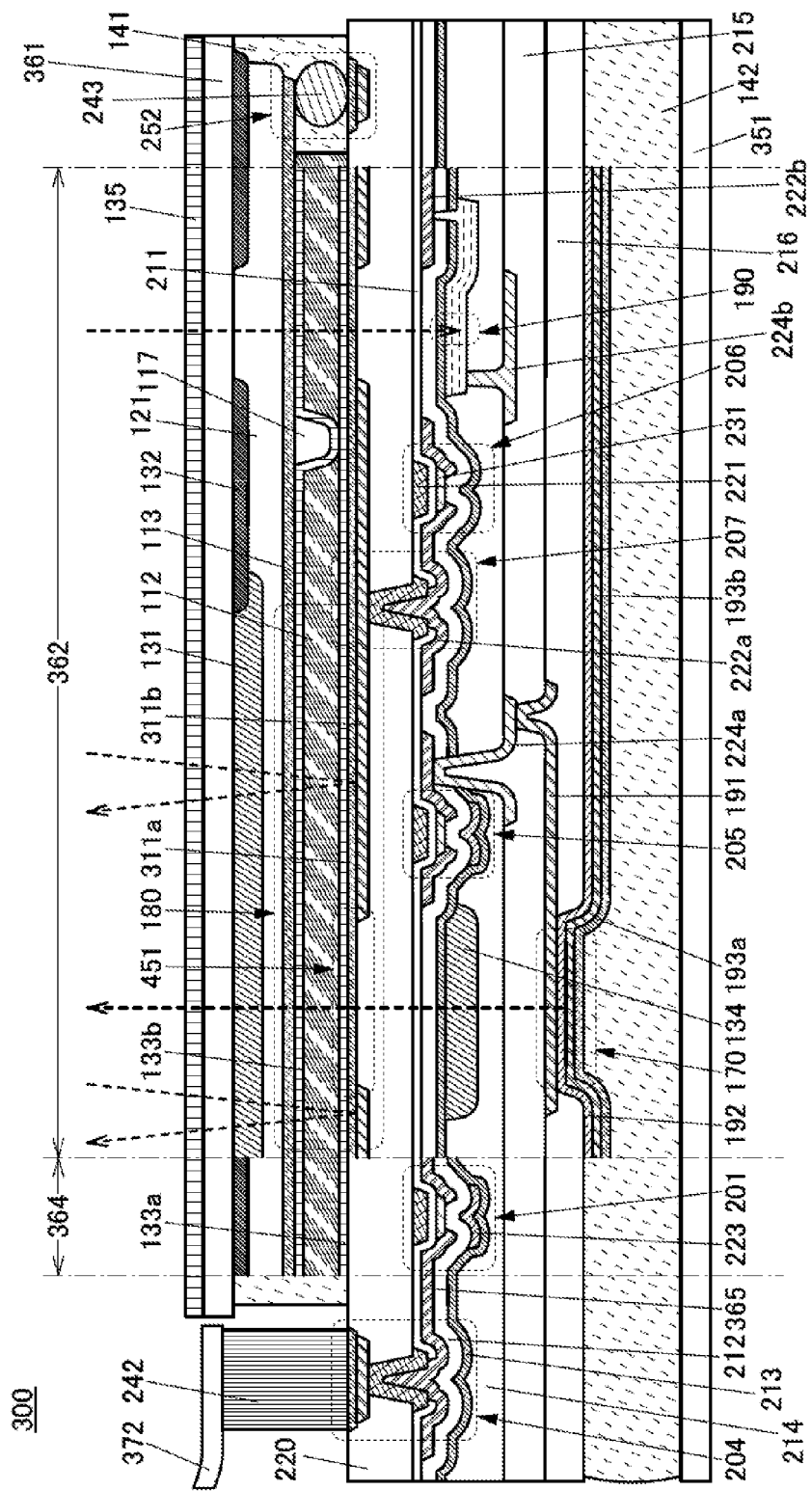
FIG. 18 is a cross-sectional view illustrating an example of a display device.

FIG. 18 illustrates examples of cross sections of part of a region including the FPC 372, part of a region including the circuit 364, and part of a region including the display portion 362 of the display device 300 illustrated as examples in FIGS. 17A and 17B.

The display device 300 illustrated in FIG. 18 includes an insulating layer 220 between the substrate 351 and the substrate 361. The light-emitting element 170, the light-receiving element 190, a transistor 201, a transistor 205, a transistor 206, a coloring layer 134, and the like are provided between the substrate 351 and the insulating layer 220. The liquid crystal element 180, a coloring layer 131, and the like are provided between the insulating layer 220 and the substrate 361. The substrate 361 and the insulating layer 220 are attached to each other with an adhesive layer 141. The substrate 351 and the insulating layer 220 are attached to each other with an adhesive layer 142.

The transistor 206 is electrically connected to the liquid crystal element 180, and the transistor 205 is electrically connected to the light-emitting element 170. The transistor 205 and the transistor 206, which are both formed on a surface of the insulating layer 220 on the substrate 351 side, can be formed through the same process.

The substrate 361 is provided with the coloring layer 131, a light-blocking layer 132, an insulating layer 121, and a conductive layer 113 functioning as a common electrode of the liquid crystal element 180, an alignment film 133*b*, an insulating layer 117, and the like. The insulating layer 117 functions as a spacer for holding a cell gap of the liquid crystal element 180.

Insulating layers such as an insulating layer 211, an insulating layer 212, an insulating layer 213, an insulating layer 214, and an insulating layer 215 are provided on the substrate 351 side of the insulating layer 220. Part of the insulating layer 211 functions as a gate insulating layer of each transistor. The insulating layer 212, the insulating layer 213, and the insulating layer 214 are provided to cover the transistors. The insulating layer 215 is provided to cover the insulating layer 214. The insulating layer 214 and the insulating layer 215 each function as a planarization layer. Note that here, the three insulating layers, the insulating layer 212, the insulating layer 213, and the insulating layer 214, are provided to cover the transistors and the like; however, the number of insulating layers is not limited to three and may be one, two, or four or more. The insulating layer 214 functioning as a planarization layer is not necessarily provided.

The transistor 201, the transistor 205, and the transistor 206 each include a conductive layer 221 part of which functions as a gate, conductive layers 222*a* part of which functions as a source and a drain, and a semiconductor layer 231. Here, a plurality of layers obtained by processing the same conductive film are shown with the same hatching pattern.

The liquid crystal element 180 is a reflective liquid crystal element. The liquid crystal element 180 has a structure in which a conductive layer 311*a*, liquid crystal 112, and the conductive layer 113 are stacked. The conductive layer 311*b* that reflects visible light is provided in contact with the conductive layer 311*a* on the substrate 351 side. The conductive layer 311*b* includes the opening 451. The conductive layer 311*a* and the conductive layer 113 transmit visible light. In addition, an alignment film 133*a* is provided between the liquid crystal 112 and the conductive layer 311*a*, and the alignment film 133*b* is provided between the liquid crystal 112 and the conductive layer 113. A polarizing plate 135 is provided on an outer surface of the substrate 361.

In the liquid crystal element 180, the conductive layer 311*b* has a function of reflecting visible light, and the conductive layer 113 has a function of transmitting visible light. Light entering from the substrate 361 side is polarized by the polarizing plate 135, passes through the conductive layer 113 and the liquid crystal 112, and is reflected from the conductive layer 311*b*. Then, the light passes through the liquid crystal 112 and the conductive layer 113 again and reaches the polarizing plate 135. In this case, the alignment of the liquid crystal is controlled by voltage applied between the conductive layer 311*b* and the conductive layer 113, and thus, optical modulation of light can be controlled. That is, the intensity of light extracted through the polarizing plate 135 can be controlled. Light other than that in a particular wavelength region is absorbed by the coloring layer 131, so that red light is extracted, for example.

The light-emitting element 170 is a bottom-emission light-emitting element. The light-emitting element 170 has a structure in which a conductive layer 191, an EL layer 192, and a conductive layer 193*b* are stacked in this order from the insulating layer 220 side. An insulating layer 216 covers an end portion of the conductive layer 191. In addition, a conductive layer 193*a* is provided to cover the conductive layer 193*b*. The conductive layer 193*b* contains a material reflecting visible light, and the conductive layer 191 and the conductive layer 193*a* contain a material transmitting visible light. Light is emitted from the light-emitting element 170 to the substrate 361 side through the coloring layer 134, the insulating layer 220, the opening 451, the conductive layer 113, and the like.

Here, as illustrated in FIG. 18, the conductive layer 311*a* transmitting visible light is preferably provided across the opening 451. In this case, the liquid crystal 112 is aligned in a region overlapping with the opening 451 as well as in the other regions, which can prevent an alignment defect of the liquid crystal from being generated in the boundary portion between these regions and causing undesired light leakage.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Such a structure can suppress reflection of external light. The cell gap, alignment, drive voltage, and the like of a liquid crystal element used as the liquid crystal element 180 are adjusted in accordance with the kind of the polarizing plate so that desirable contrast is obtained.

One of a source and a drain of the transistor 205 is electrically connected to the conductive layer 191 of the light-emitting element 170 through a conductive layer 224a.

One of a source and a drain of the transistor 206 is electrically connected to the conductive layer 311b through a connection portion 207. The conductive layer 311b and the conductive layer 311a are in contact with and electrically connected to each other. Here, in the connection portion 207, the conductive layers provided on both surfaces of the insulating layer 220 are connected to each other through an opening of the insulating layer 220.

The light-receiving element 190 includes a stack of a p-type semiconductor layer, an i-type semiconductor layer, and an n-type semiconductor layer. One of conductive layers 222b and 224b is connected to the p-type semiconductor layer, and the other thereof is connected to the n-type semiconductor layer. The light-receiving element 190 has a portion which does not overlap with the coloring layer 131, the light-blocking layer 132, and the conductive layer 311b reflecting visible light. From this portion, external light enters the light-receiving element 190. The conductive layer 224b has a function of reflecting light having passed through the light-receiving element 190.

A connection portion 204 is provided in a region in which the substrate 351 and the substrate 361 do not overlap with each other. In the connection portion 204, the wiring 365 is electrically connected to the FPC 372 through a connection layer 242. The connection portion 204 has a structure similar to that of the connection portion 207. On a top surface of the connection portion 204, a conductive layer obtained by processing the same conductive film as the conductive layer 311a is exposed. Thus, the connection portion 204 and the FPC 372 can be electrically connected to each other through the connection layer 242.

A connection portion 252 is provided in part of a region in which the adhesive layer 141 is provided. In the connection portion 252, a conductive layer obtained by processing the same conductive film as the conductive layer 311a is electrically connected to part of the conductive layer 113 through a connector 243. Accordingly, a signal or a potential input from the FPC 372 connected on the substrate 351 side can be supplied to the conductive layer 113 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 243, a material capable of elastic deformation or plastic deformation is preferably used. As illustrated in FIG. 18, the connector 243, which is the conductive particle, may have a shape that is vertically crushed. This can increase the contact area between the connector 243 and a conductive layer electrically connected to the connector 243, thereby reducing the contact resistance and suppressing problems such as disconnection.

The connector 243 is preferably provided so as to be covered with the adhesive layer 141. For example, the connector 243 may be dispersed in the adhesive layer 141 which is not cured yet.

FIG. 18 illustrates an example of the circuit 364 including the transistor 201.

In FIG. 18, for example, the transistor 201 and the transistor 205 each have a structure in which the semiconductor layer 231 in which a channel is formed is provided between two gates. One gate is formed using the conductive layer 221, and the other gate is formed using a conductive layer 223 which overlaps with the semiconductor layer 231 with the insulating layer 212 positioned therebetween. Such a structure enables the control of the threshold voltage of the transistor. In that case, the two gates may be connected to each other and supplied with the same signal to operate the transistor. Such a transistor can have higher field-effect mobility and have higher on-state current than other transistors. Consequently, a circuit capable of high-speed operation can be obtained. Furthermore, the area occupied by a circuit portion can be reduced. The use of the transistor having high on-state current can reduce signal delay in wirings and suppress display unevenness even when the number of wirings is increased owing to an increase in the size or resolution of the display device.

Note that the transistor included in the circuit 364 and the transistor included in the display portion 362 may have the same structure. A plurality of transistors included in the circuit 364 may have the same structure or different structures. A plurality of transistors included in the display portion 362 may have the same structure or different structures.

A material inhibiting diffusion of impurities such as water and hydrogen is preferably used for at least one of the insulating layers 212 and 213 which cover the transistors. That is, the insulating layer 212 or the insulating layer 213 can function as a barrier film. Such a structure can effectively suppress diffusion of the impurities into the transistors from the outside, and thus, a highly reliable display device can be provided.

The insulating layer 121 is provided on the substrate 361 side to cover the coloring layer 131 and the light-blocking layer 132. The insulating layer 121 may function as a planarization layer. The insulating layer 121 enables the conductive layer 113 to have a substantially flat surface, resulting in a uniform alignment state of the liquid crystal 112.

An example of a method for manufacturing the display device 300 will be described. For example, the conductive layer 311a, the conductive layer 311b, and the insulating layer 220 are formed in order over a support substrate provided with a separation layer, and then, the transistor 205, the transistor 206, the light-emitting element 170, the light-receiving element 190, and the like are formed. Then, the substrate 351 and the support substrate are attached to each other with the adhesive layer 142. After that, the separation layer is separated from the insulating layer 220 and the conductive layer 311a along the interfaces therewith, whereby the support substrate and the separation layer are removed. Meanwhile, the substrate 361 over which the coloring layer 131, the light-blocking layer 132, the conductive layer 113, and the like are formed in advance is prepared. Then, the liquid crystal 112 is dropped onto the substrate 351 or the substrate 361 and the substrate 351 and the substrate 361 are attached to each other with the adhesive layer 141, whereby the display device 300 can be manufactured.

A material of the separation layer can be selected such that separation at the interfaces with the insulating layer 220 and the conductive layer 311a occurs. In particular, it is preferable that a stack of a layer containing a high-melting-point metal material, such as tungsten, and a layer containing an oxide of the metal material be used as the separation layer and that a stack of a plurality of layers, such as a silicon nitride layer, a silicon oxynitride layer, and a silicon nitride oxide layer, be used as the insulating layer 220 over the separation layer. When a high-melting-point metal material is used for the separation layer, layers can be formed at high temperatures in later steps; thus, the impurity concentration can be reduced and a highly reliable display device can be fabricated.

As the conductive layer 311a, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is increased as compared with a semiconductor layer of a transistor is used for the conductive layer 311a.

For the substrate 351 and the substrate 361, glass, quartz, ceramic, sapphire, an organic resin, or the like can be used. When the substrate 351 and the substrate 361 are formed using a flexible material, the flexibility of the display device can be increased.

The liquid crystal element 180 can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element 180 can employ a variety of modes; for example, besides the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, or an anti-ferroelectric liquid crystal (AFLC) mode can be used.

The liquid crystal element is an element that controls transmission or non-transmission of light by utilizing an optical modulation action of the liquid crystal. The optical modulation action of the liquid crystal is controlled by an electric field (including a horizontal electric field, a vertical electric field, and an oblique electric field) applied to the liquid crystal. As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either positive liquid crystal or negative liquid crystal may be used; an appropriate liquid crystal material may be used in accordance with the mode or design to be used.

To control the alignment of the liquid crystal, an alignment film can be provided. In the case where a horizontal electric field mode is employed, liquid crystal exhibiting a blue phase for which an alignment film is unnecessary may be used. The blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which several weight percent or more of a chiral material is mixed is used for a liquid crystal layer in order to improve the temperature range. The liquid crystal composition that includes liquid crystal exhibiting a blue phase and a chiral material has a short response time and has optical isotropy. In addition, the liquid crystal composition that includes liquid crystal exhibiting a blue phase and a chiral material does not need alignment treatment and has small viewing angle dependence. An alignment film does not need to be provided and rubbing treatment is thus unnecessary; accordingly, electrostatic discharge damage caused by the rubbing treatment can be prevented and defects and damage of the liquid crystal display device in the manufacturing process can be reduced.

In the case where a reflective liquid crystal element is used, a polarizing plate is provided on the display surface side. In addition, a light diffusion plate is preferably provided on the display surface side to improve visibility.

A front light may be provided on the outer side of the polarizing plate. As the front light, an edge-lit front light is preferably used. A front light including a light-emitting diode (LED) is preferably used to reduce power consumption.

As the adhesive layer, a variety of curable adhesives, e.g., a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component resin may be used. Further alternatively, an adhesive sheet or the like may be used.

As the connection layer 242, an anisotropic conductive film (ACF), an anisotropic conductive paste (ACP), or the like can be used.

Note that the description in Embodiment 1 can also be referred to for materials of the layers included in the display device 300.

As described above, the display device of this embodiment includes two kinds of display elements and can be switched between a plurality of display modes. Furthermore, the display device can perform display that is most suitable for the usage environment by detecting the amount of light delivered to the light-receiving element. Accordingly, a display device with low power consumption can be provided. Moreover, a display device having high visibility regardless of the ambient brightness can be provided.

This embodiment can be combined with any of the other embodiments as appropriate.

Embodiment 3

In this embodiment, a display device of one embodiment of the present invention will be described with reference to FIG. 19, FIG. 20, FIG. 21, and FIG. 22.

The display device of this embodiment includes a light-receiving element, a first display element that reflects visible light, and a second display element that emits visible light. The display device has a function of changing the gray level of the second display element in accordance with the amount of light detected by the light-receiving element.

The display device of this embodiment has a function similar to that of the display device described in Embodiment 2.

Specifically, the display device of this embodiment has a function of displaying an image by using light reflected from the first display element and/or light emitted from the second display element.

The display device of this embodiment has a first mode in which an image is displayed using only the first display element, a second mode in which an image is displayed using only the second display element, and a third mode in which an image is displayed using both the first display element and the second display element. These modes can be automatically or manually switched.

In the first mode, an image is displayed using the first display element and external light. In the second mode, an image is displayed using light emitted from the second display element. In the third mode, an image is displayed using both light reflected from the first display element and light emitted from the second display element.

With such a structure, an all-weather display device or a convenient display device having high visibility regardless of the ambient brightness can be provided. In the display device of this embodiment, especially in the second mode or the third mode, the amount of light delivered to the light-receiving element is detected, and the gray level of the second display element is changed in accordance with the amount of detected light; thus, an image can be displayed with a brightness suitable for the usage environment.

The display device of this embodiment further has a function of stopping the light emission from the second display element when the amount of light detected by the photodetector circuit reaches or exceeds a certain level. For example, in the case where a user of the display device moves from a dark environment to a bright environment, the display device is automatically switched from the second mode or the third mode to the first mode. According to one embodiment of the present invention, the display device can become more convenient.

Configuration Example 3 of Pixel Unit

Figure 19:
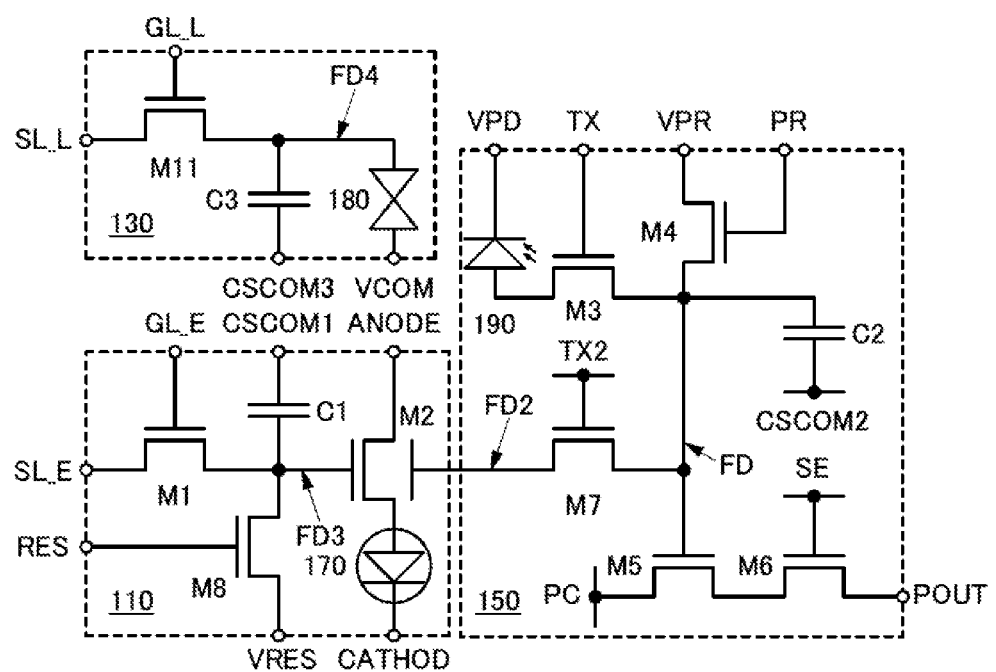
FIG. 19 is a circuit diagram illustrating an example of a pixel unit.

FIG. 19 is a circuit diagram illustrating the photodetector circuit 150, the pixel circuit 110, and the pixel circuit 130 included in a pixel unit.

In the pixel unit, the photodetector circuit 150 and the pixel circuit 110 are electrically connected to each other. The pixel circuit 110 includes the light-emitting element 170. The pixel circuit 130 includes a liquid crystal element.

The photodetector circuit 150 has a configuration similar to that in FIG. 2A; in this regard, refer to the description in Embodiment 1.

The pixel circuit 130 has a configuration similar to that in FIG. 13; in this regard, refer to the description in Embodiment 2.

The pixel circuit 110 includes a transistor M8 in addition to the components illustrated in FIG. 2A. A gate of the transistor M8 is electrically connected to a wiring RES. One of a source and a drain of the transistor M8 is connected to the other of the source and the drain of the transistor M1, the one electrode of the capacitor C1, and the first gate of the transistor M2, and the other of the source and the drain of the transistor M8 is electrically connected to a wiring VRES.

Except for the transistor M8, the configuration is similar to that in FIG. 2A; in this regard, refer to the description in Embodiment 1.

Figure 20:
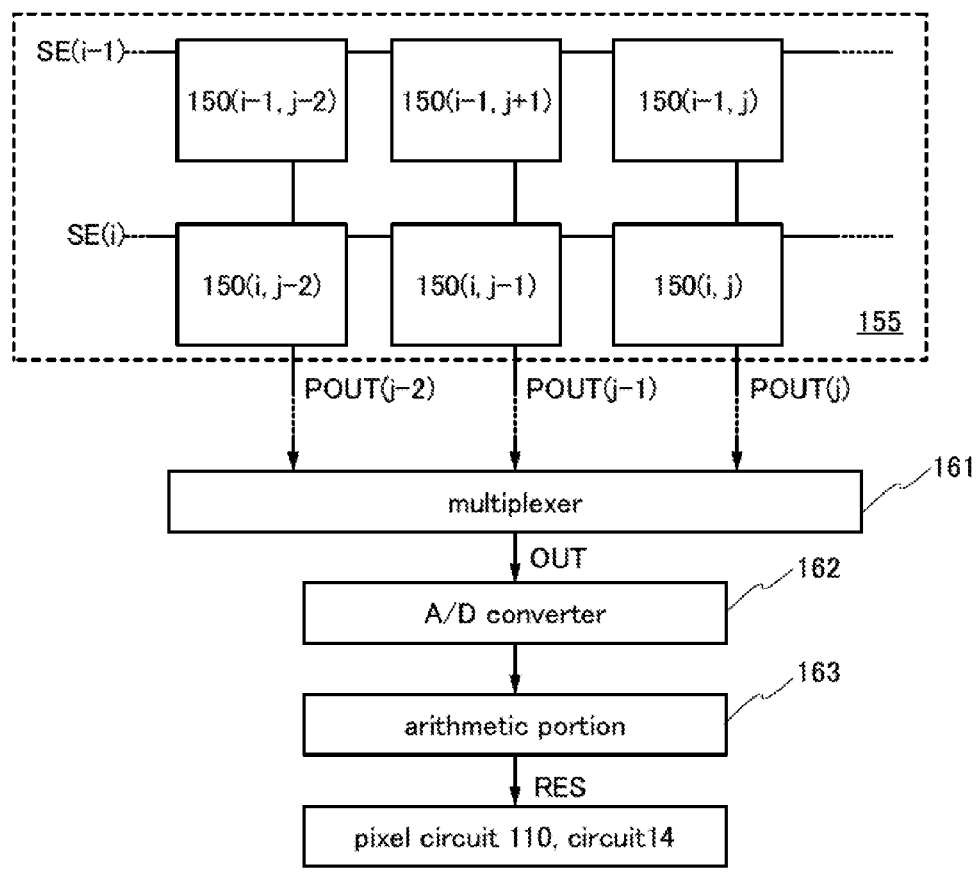
FIG. 20 is a block diagram illustrating an example of a display device.

FIG. 20 is a block diagram illustrating a photodetector circuit unit 155 and peripheral circuits. FIG. 20 illustrates part of the photodetector circuit unit 155, namely i×j photodetector circuits 150.

The multiplexer 161 has a function of selecting one of wirings POUT(1) to POUT(j) and outputting a signal to the wiring OUT.

The signal output to the wiring OUT is converted to a digital signal by an A/D converter 162.

An arithmetic portion 163 has a function of judging, on the basis of a signal output from the AD converter 162, whether or not to stop the light emission from the light-emitting element 170. The judgement can be performed in accordance with the amount of light detected by one or more photodetector circuits 150. For example, the following configuration may be employed: the light emission from the light-emitting element 170 is stopped when the amount of light detected by the light-receiving elements 190 in 80% or more of the i×j photodetector circuits 150 reaches or exceeds a certain level. When the amount of light detected by the light-receiving elements 190 is judged to have reached or exceeded a certain level, the arithmetic portion 163 supplies a high-level potential to the wiring RES.

The photodetector circuit 150 outputs a first signal corresponding to the amount of detected light. The arithmetic portion 163 can be regarded as a signal generation circuit which generates a second signal corresponding to the first signal.

When the potential of the wiring RES becomes a high level, the transistor M8 is turned on and a potential close to the potential of the wiring VRES (a low-level potential) is supplied to the node FD3, so that the amount of charge retained at the node FD3 is reset. Consequently, the transistor M2 is turned off, and the light-emitting element 170 ceases to emit light.

In a similar manner, the operation of a scan line driver circuit (also referred to as a gate driver) which is electrically connected to the pixel circuit 110 can be stopped by changing the potential of the wiring RES.

In the case where the display mode is switched from the second mode (the state in which the liquid crystal element 180 is not used to display an image) to the first mode (the state in which the liquid crystal element 180 is used to display an image), a signal is preferably supplied from the arithmetic portion 163 to the pixel circuit 130 or a scan line driver circuit which is electrically connected to the pixel circuit 130, in order to start the display with the liquid crystal element 180.

There is no particular limitation on the configuration of the gate driver. For example, a transistor including silicon or an oxide semiconductor may be used for the gate driver.

The gate driver can be formed using multistage shift registers. Here, a reset function of the gate driver will be described focusing on the operation of a shift register of the first stage.

Figure 21:
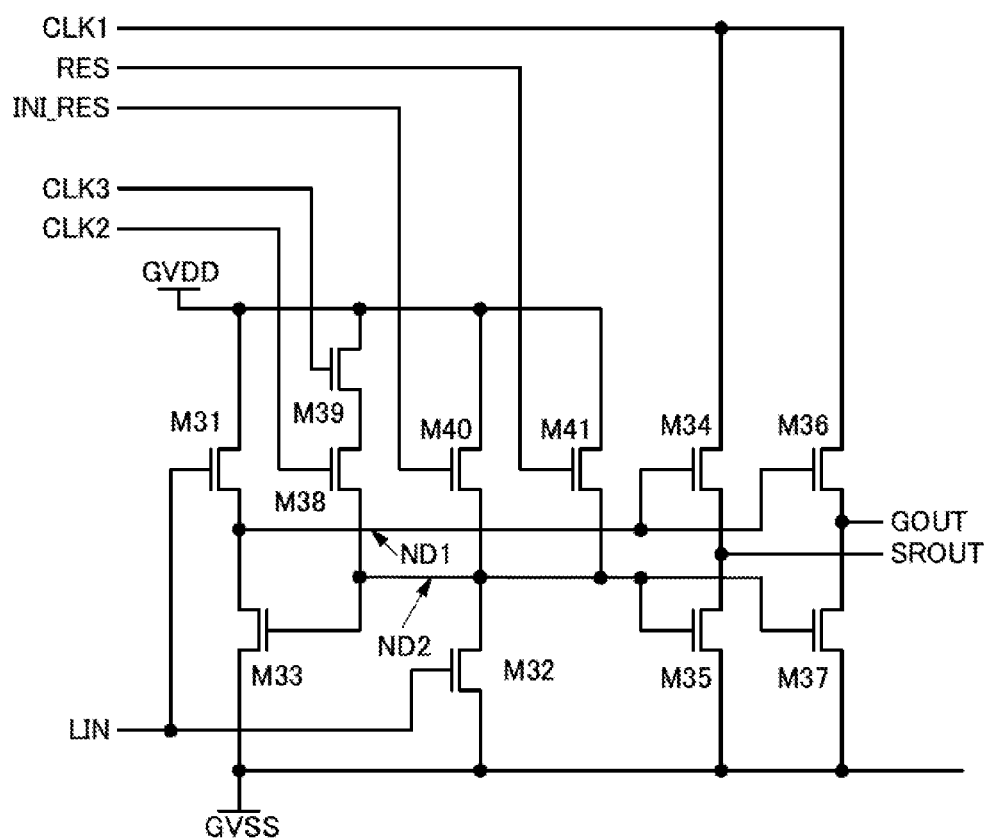
FIG. 21 is a circuit diagram illustrating an example of a shift register.

A shift register circuit illustrated in FIG. 21 includes eleven transistors (transistors M31 to M41).

A gate of the transistor M31 is electrically connected to a wiring LIN and a gate of the transistor M32. One of a source and a drain of the transistor M31 is electrically connected to a high power supply potential GVDD, one of a source and a drain of the transistor M39, one of a source and a drain of the transistor M40, and one of a source and a drain of the transistor M41. The other of the source and the drain of the transistor M31 is connected to a node ND1 and is electrically connected to one of a source and a drain of the transistor M33, a gate of the transistor M34, and a gate of the transistor M36.

One of a source and a drain of the transistor M32 is electrically connected to a low power supply potential GVSS, the other of the source and the drain of the transistor M33, one of a source and a drain of the transistor M35, and one of a source and a drain of the transistor M37. The other of the source and the drain of the transistor M32 is connected to a node ND2 and is electrically connected to a gate of the transistor M33, a gate of the transistor M35, a gate of the transistor M37, one of a source and a drain of the transistor M38, the other of the source and the drain of the transistor M40, and the other of the source and the drain of the transistor M41.

One of a source and a drain of the transistor M34 is electrically connected to a clock signal line CLK1 and one of a source and a drain of the transistor M36. The other of the source and the drain of the transistor M34 is electrically connected to the other of the source and the drain of the transistor M35 and a wiring SROUT.

The other of the source and the drain of the transistor M36 is electrically connected to the other of the source and the drain of the transistor M37 and a wiring GOUT.

A gate of the transistor M38 is electrically connected to a clock signal line CLK2. A gate of the transistor M39 is electrically connected to a clock signal line CLK3. The other of the source and the drain of the transistor M38 is electrically connected to the other of the source and the drain of the transistor M39.

A gate of the transistor M40 is electrically connected to a wiring INI_RES. A gate of the transistor M41 is electrically connected to the wiring RES.

The wiring SROUT is connected to the wiring LIN of the shift register of the next stage. The wiring GOUT serves as a selection signal line of the gate driver and is connected to a gate line of each pixel.

Figure 22:
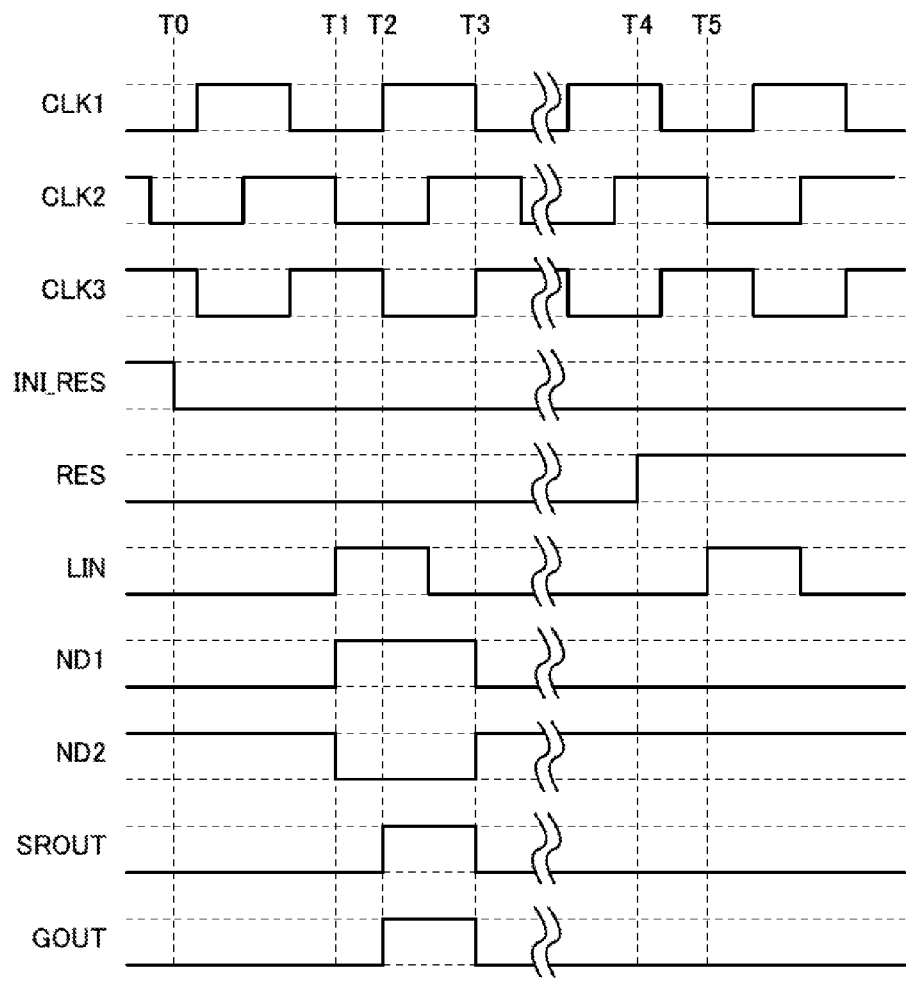
FIG. 22 is an example of a timing chart of a shift register.

FIG. 22 is a timing chart of the shift register circuit illustrated in FIG. 21.

Until Time T0, the potential of the wiring INI_RES is at a high level, that is, the gate driver is in an initialized state. Note that the wiring INI_RES can be supplied with a high-level potential at a timing desired by a user. That is, the operation of the gate driver can be reset at a timing desired by the user.

At Time T1, the potential of the wiring LIN is changed from the low level to the high level to turn on the transistor M31; thus, the potential of the node ND1 becomes the high level. The transistor M32 is also turned on, so that the potential of the node ND2 becomes the low level. Accordingly, the transistor M34 and the transistor M36 are turned on, and the transistor M35 and the transistor M37 are turned off. Here, since the focus is placed on the shift register of the first stage, a signal of the wiring LIN can be regarded as a start pulse.

At Time T2, the potential of the clock signal line CLK1 becomes the high level, so that a high-level potential is output from the wiring SROUT via the transistor M34. In addition, a high-level potential is output from the wiring GOUT via the transistor M36. After Time T2, the potential of the wiring LIN becomes the low level, whereas the potential of the node ND1 and the potential of the node ND2 each keep the previous state.

At Time T3, both the potential of the clock signal line CLK2 and the potential of the clock signal line CLK3 are at the high level, and thus, the transistor M38 and the transistor M39 are on; consequently, the potential of the node ND2 becomes the high level. Since the potential of the node ND2 is at the high level, the transistor M33 is turned on and the potential of the node ND1 becomes the low level. The transistor M35 is also turned on, so that the potential of the wiring SROUT becomes the low level. The transistor M37 is also turned on, so that the potential of the wiring GOUT becomes the low level.

In the above manner, a selection signal is transmitted from one shift register to another.

Next, a method in which the wiring RES is used to force the gate driver to stop operating will be described.

At Time T4, the potential of the wiring RES is changed from the low level to the high level to turn on the transistor M41; thus, the potential of the node FD2 becomes the high level. Accordingly, the potential of the node ND1 becomes the low level.

Even when the potential of the wiring LIN is changed from the low level to the high level at Time T5, the potential of the wiring RES keeps the potential of the node ND2 at the high level and does not allow the start pulse signal from the wiring LIN to be transmitted.

By changing the potential of the wiring RES in the above manner, the operation of the gate driver can be stopped.

In a period in which the potential of a wiring which supplies a reset signal, such as the wiring RES or the wiring INI_RES, is at the high level, the potential of the wiring LIN which supplies the start pulse signal may be constantly at the low level.

As described above, in the display device of this embodiment, the light emission from the light-emitting element can be stopped when the amount of light delivered to the light-receiving element reaches or exceeds a certain level. Accordingly, display that is most suitable for the usage environment can be performed. Moreover, the power consumption of the display device can be reduced.

This embodiment can be combined with any of the other embodiments as appropriate.

Embodiment 4

In this embodiment, the composition of a cloud-aligned composite oxide semiconductor (CAC-OS) which can be used for a transistor disclosed in one embodiment of the present invention will be described.

The CAC-OS refers to, for example, an oxide semiconductor material with a composition in which elements are unevenly distributed in regions each having a size of greater than or equal to 0.5 nm and less than or equal to 10 nm, preferably greater than or equal to 1 nm and less than or equal to 2 nm, or a similar size. Note that in the following description of an oxide semiconductor, the state in which one or more metal elements are unevenly distributed in regions each having a size of greater than or equal to 0.5 nm and less than or equal to 10 nm, preferably greater than or equal to 1 nm and less than or equal to 2 nm, or a similar size and the regions including the metal element(s) are mixed is referred to as a mosaic pattern or a patch-like pattern.

Note that the oxide semiconductor preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

As an example of the CAC-OS, an In—Ga—Zn oxide with the CAC composition (such an In—Ga—Zn oxide may be particularly referred to as CAC-IGZO) will be described. The CAC-IGZO has a composition with a mosaic pattern in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0) and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), for example. Furthermore, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region has a higher In concentration than the second region.

Note that a compound containing In, Ga, Zn, and O is known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a c-axis aligned crystalline (CAAC) structure. Note that the CAAC structure is a crystal structure in which a plurality of IGZO nanocrystals has c-axis alignment and is connected in the a-b plane direction without alignment.

On the other hand, the CAC-OS relates to the material composition of an oxide semiconductor. In part of the material composition of a CAC-OS containing In, Ga, Zn, and O, nanoparticle regions including Ga as a main component and nanoparticle regions including In as a main component are observed. These nanoparticle regions are randomly dispersed in a mosaic pattern. Therefore, the crystal structure is a secondary element for the CAC-OS.

Note that the CAC-OS does not include a stacked-layer structure of two or more films with different compositions. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In part of the composition of a CAC-OS which contains, instead of gallium, one or more metal elements selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like, nanoparticle regions including the metal element(s) as a main component (s) and nanoparticle regions including In as a main component are observed. These nanoparticle regions are randomly dispersed in a mosaic pattern.

The CAC-OS can be formed by a sputtering method under conditions where a substrate is not heated intentionally, for example. In the case of forming the CAC-OS by a sputtering method, one or more gases selected from an inert gas (typically, argon), an oxygen gas, and a nitrogen gas may be used as a deposition gas. The percentage of the oxygen gas flow rate in the total flow rate of the deposition gas at the time of deposition is preferably as low as possible; for example, the percentage of the oxygen gas flow rate is preferably higher than or equal to 0% and lower than 30%, further preferably higher than or equal to 0% and lower than or equal to 10%.

The CAC-OS is characterized in that no clear peak is observed in measurement using $\theta/2\theta$ scan by an out-of-plane method, which is an X-ray diffraction (XRD) measurement method. That is, XRD shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view direction and the cross-sectional direction.

For example, an energy dispersive X-ray spectroscopy (EDX) mapping image confirms that an In—Ga—Zn oxide with the CAC composition has a structure in which regions including $GaO_{X3}$ as a main component and regions including $In_{X2}Zn_{Y2}O_{Z2}$ or $InO_{X1}$ as a main component are unevenly distributed and mixed.

The CAC-OS has a structure and characteristics different from those of an IGZO compound in which metal elements are evenly distributed. That is, in the CAC-OS, regions including $GaO_{X3}$ or the like as a main component and regions including $In_{X2}Zn_{Y2}O_{Z2}$ or $InO_{X1}$ as a main component are phase-separated from each other in a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the oxide semiconductor exhibits conductivity. Accordingly, when the regions including $In_{X2}Zn_{Y2}O_{Z2}$ or $InO_{X1}$ as a main component are distributed in the oxide semiconductor like a cloud, high field-effect mobility ($\mu$) can be achieved.

In contrast, the insulating property of the region including $GaO_{X3}$ or the like as a main component is higher than that of the region including $In_{X2}Zn_{Y2}O_{Z2}$ or $InO_{X1}$ as a main component. In other words, when the regions including $GaO_{X3}$ or the like as a main component are distributed in the oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used for a variety of semiconductor devices typified by a display.

This embodiment can be combined with any of the other embodiments as appropriate.

Embodiment 5

In this embodiment, a display module and electronic devices will be described as embodiments of the present invention.

Figure 23:
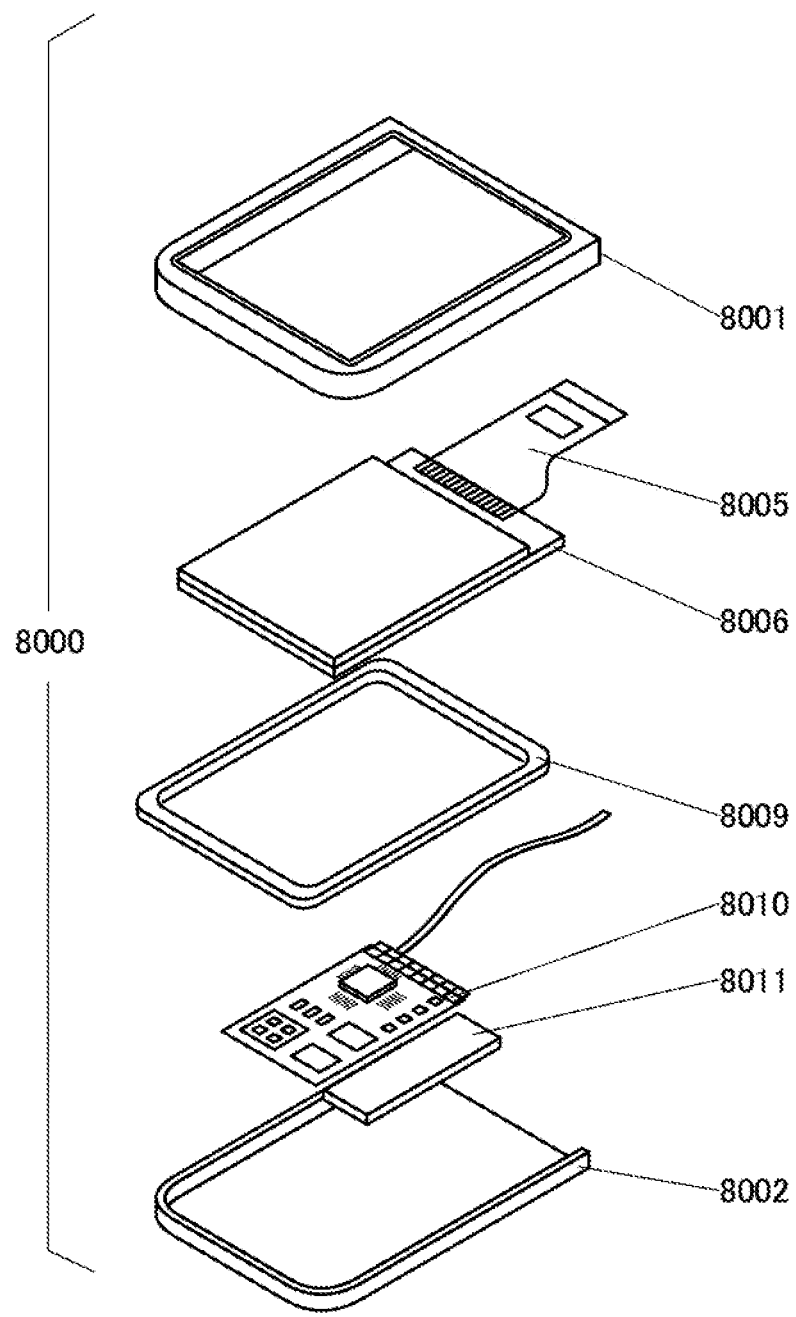
FIG. 23 illustrates an example of a display module.

In a display module 8000 in FIG. 23, a display panel 8006 connected to an FPC 8005, a frame 8009, a printed board 8010, and a battery 8011 are provided between an upper cover 8001 and a lower cover 8002.

The display device of one embodiment of the present invention can be used for, for example, the display panel 8006. The display panel 8006 has a touch panel function. In the display module of this embodiment, the light emission from a light-emitting element can be stopped when the amount of light delivered to a light-receiving element reaches or exceeds a certain level. Accordingly, display that is most suitable for the usage environment can be performed. Moreover, the power consumption of the display module can be reduced.

The shape and size of the upper cover 8001 and the lower cover 8002 can be changed as appropriate in accordance with the size of the display panel 8006.

The frame 8009 protects the display panel 8006 and functions as an electromagnetic shield for blocking electromagnetic waves generated by the operation of the printed board 8010. The frame 8009 may also function as a radiator plate.

The printed board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

The display device of one embodiment of the present invention can achieve high visibility regardless of the intensity of external light. Thus, the display device of one embodiment of the present invention can be suitably used for a portable electronic device, a wearable electronic device (wearable device), an e-book reader, and the like.

Figure 24A:
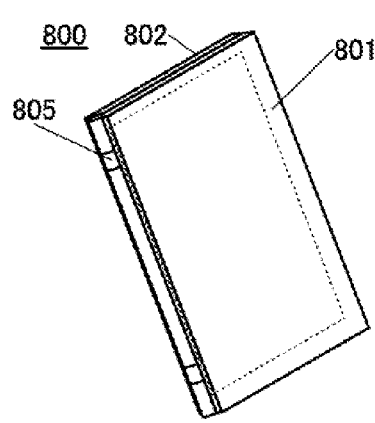
FIGS. 24A to 24D illustrate examples of electronic devices.
Figure 24B:
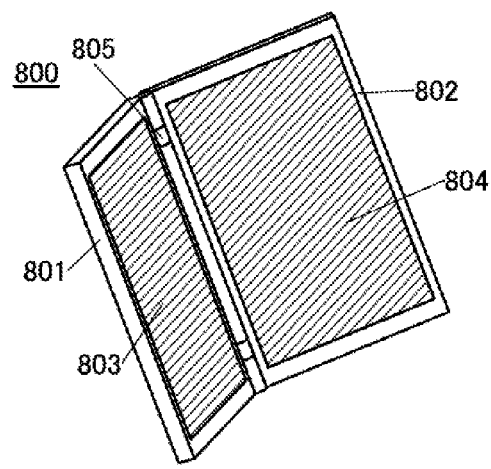

A portable information terminal 800 illustrated in FIGS. 24A and 24B includes a housing 801, a housing 802, a display portion 803, a display portion 804, a hinge portion 805, and the like.

The housing 801 and the housing 802 are joined together by the hinge portion 805. The portable information terminal 800 in a closed state (FIG. 24A) can be opened as illustrated in FIG. 24B.

The display device of one embodiment of the present invention can be used for the display portion 803 and/or the display portion 804.

The display portion 803 and the display portion 804 can each display at least one of text information, a still image, a moving image, and the like. When text information is displayed on the display portion, the portable information terminal 800 can be used as an e-book reader.

The foldable portable information terminal 800 has high portability and excellent versatility.

The housing 801 and the housing 802 may have a power button, an operation button, an external connection port, a speaker, a microphone, or the like.

Figure 24C:
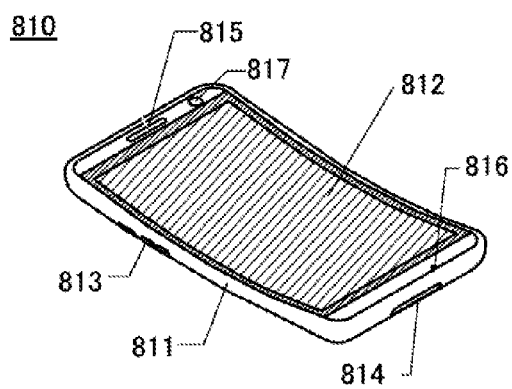

A portable information terminal 810 illustrated in FIG. 24C includes a housing 811, a display portion 812, an operation button 813, an external connection port 814, a speaker 815, a microphone 816, a camera 817, and the like.

The display device of one embodiment of the present invention can be used for the display portion 812. In the portable information terminal of this embodiment, the light emission from a light-emitting element can be stopped when the amount of light delivered to a light-receiving element reaches or exceeds a certain level. Accordingly, display that is most suitable for the usage environment can be performed. Moreover, the power consumption of the portable information terminal can be reduced.

The portable information terminal 810 includes a touch sensor in the display portion 812. Operations such as making a call and inputting text can be performed by a touch on the display portion 812 with a finger, a stylus, or the like.

With the operation buttons 813, power can be turned on/off, and types of images displayed on the display portion 812 can be switched, for example, from a mail creation screen to a main menu screen.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). Furthermore, the direction of display on the screen can be changed by a touch on the display portion 812, operation with the operation button 813, sound input using the microphone 816, or the like.

The portable information terminal 810 functions as, for example, one or more of a telephone set, a notebook, and an information browsing system. Specifically, the portable information terminal 810 can be used as a smartphone. The portable information terminal 810 can execute a variety of applications such as mobile phone calls, e-mailing, viewing and editing texts, music reproduction, video reproduction, Internet communication, and games.

Figure 24D:
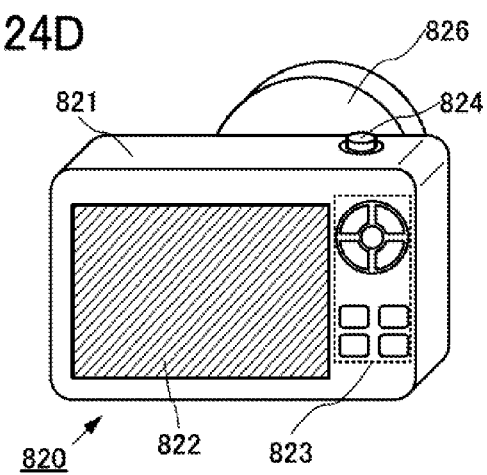

A camera 820 illustrated in FIG. 24D includes a housing 821, a display portion 822, operation buttons 823, a shutter button 824, and the like. The camera 820 is provided with a detachable lens 826.

The display device of one embodiment of the present invention can be used for the display portion 822. In the camera of this embodiment, the light emission from a light-emitting element can be stopped when the amount of light delivered to a light-receiving element reaches or exceeds a certain level. Accordingly, display that is most suitable for the usage environment can be performed. Moreover, the power consumption of the camera can be reduced.

Although the lens 826 of the camera 820 here is detachable from the housing 821 for replacement, the lens 826 may be integrated with the housing 821.

A still image or a moving image can be taken with the camera 820 by pushing the shutter button 824. In addition, an image can be taken by a touch on the display portion 822 which functions as a touch panel.

Note that a stroboscope, a viewfinder, or the like can be additionally attached to the camera 820. Alternatively, these may be incorporated in the housing 821.

FIGS. 25A to 25E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device of one embodiment of the present invention can be suitably used for the display portion 9001. In the electronic device of this embodiment, the light emission from a light-emitting element can be stopped when the amount of light delivered to a light-receiving element reaches or exceeds a certain level. Accordingly, display that is most suitable for the usage environment can be performed. Moreover, the power consumption of the electronic device can be reduced.

The electronic devices illustrated in FIGS. 25A to 25E can have a variety of functions, for example, a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a storage medium and displaying it on the display portion. Note that the functions of the electronic devices illustrated in FIGS. 25A to 25E are not limited to the above examples, and the electronic devices may have other functions.

Figure 25A:
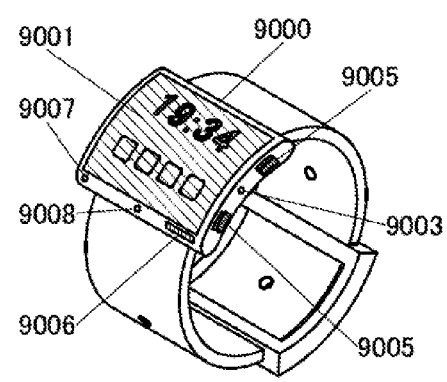
FIGS. 25A to 25E illustrate examples of electronic devices.
Figure 25B:
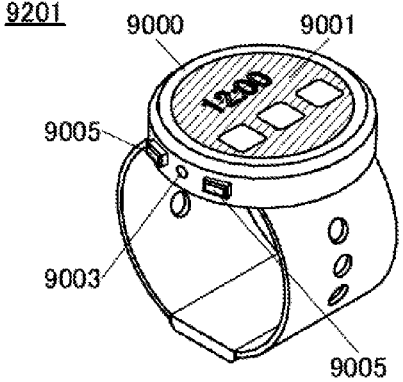

FIG. 25A is a perspective view of a watch-type portable information terminal 9200. FIG. 25B is a perspective view of a watch-type portable information terminal 9201.

The portable information terminal 9200 illustrated in FIG. 25A can execute a variety of applications such as mobile phone calls, e-mailing, viewing and editing texts, music reproduction, Internet communication, and computer games. The display surface of the display portion 9001 is curved, and an image can be displayed on the curved display surface. The portable information terminal 9200 can employ near field communication conformable to a communication standard. In this case, for example, mutual communication between the portable information terminal 9200 and a headset capable of wireless communication can be performed, and thus, hands-free calling is possible. With the connection terminal 9006, the portable information terminal 9200 can directly communicate data with another information terminal via a connector. Power charging through the connection terminal 9006 is also possible. Note that the charging operation may be performed by wireless power feeding without using the connection terminal 9006.

Unlike in the portable information terminal 9200 illustrated in FIG. 25A, the display surface of the display portion 9001 is not curved in the portable information terminal 9201 illustrated in FIG. 25B. Furthermore, the display portion of the portable information terminal 9201 has a non-rectangular outer shape (a circular shape in FIG. 25B).

Figure 25C:
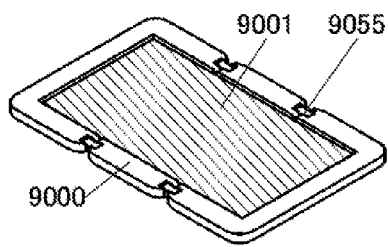
Figure 25D:
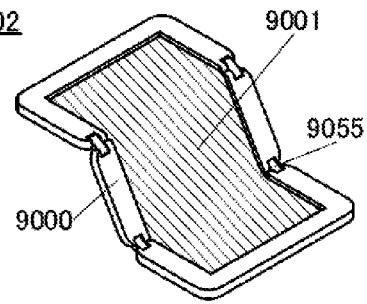
Figure 25E:
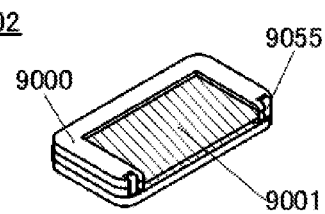

FIGS. 25C to 25E are perspective views of a foldable portable information terminal 9202. FIG. 25C is a perspective view illustrating the portable information terminal 9202 that is opened. FIG. 25D is a perspective view illustrating the portable information terminal 9202 that is being opened or being folded. FIG. 25E is a perspective view illustrating the portable information terminal 9202 that is folded.

The portable information terminal 9202 is highly portable when folded. When the portable information terminal 9202 is opened, the seamless large display region is highly browsable. The display portion 9001 of the portable information terminal 9202 is supported by three housings 9000 joined together by hinges 9055. By being folded at the hinges 9055 between two housings 9000, the portable information terminal 9202 can be reversibly changed in shape from the opened state to the folded state. For example, the portable information terminal 9202 can be bent with a radius of curvature of greater than or equal to 1 mm and less than or equal to 150 mm.

This embodiment can be combined with any of the other embodiments as appropriate.

This application is based on Japanese Patent Application Serial No. 2016-119831 filed with Japan Patent Office on Jun. 16, 2016, the entire contents of which are hereby incorporated by reference.

What is claimed is:
1. A display device comprising:
a photodetector circuit; and
a pixel circuit,
wherein the photodetector circuit comprises:
  a light-receiving element;
  a first transistor; and
  a second transistor,
wherein the pixel circuit comprises:
  a light-emitting element; and
  a third transistor,
  wherein one of a source and a drain of the first transistor is electrically connected to a first electrode of the light-receiving element,
  wherein the one of the source and the drain of the first transistor is electrically connected to one of a source and a drain of the second transistor,
  wherein the other of the source and the drain of the second transistor is electrically connected to one of two gates of the third transistor, and
  wherein one of a source and a drain of the third transistor is electrically connected to a first electrode of the light-emitting element.

2. The display device according to claim 1,
wherein the pixel circuit further comprises a liquid crystal element that reflects visible light.

3. The display device according to claim 1, further comprising a signal generation circuit,
wherein the pixel circuit comprises a fourth transistor,
wherein one of a source and a drain of the fourth transistor is electrically connected to the other of the two gates of the third transistor,
wherein the photodetector circuit is configured to output a first signal corresponding to the amount of light detected by the light-receiving element, and
wherein the signal generation circuit is configured to generate a second signal corresponding to the first signal and supply the second signal to a gate of the fourth transistor.

4. The display device according to claim 3,
wherein the photodetector circuit comprises a fifth transistor, and
wherein one of a source and a drain of the fifth transistor is electrically connected to the one of the source and the drain of the first transistor and the other of the source and the drain of the fifth transistor is electrically connected to the first electrode of the light-receiving element.

5. The display device according to claim 1, wherein the second transistor comprises an oxide semiconductor in a channel formation region.

6. The display device according to claim 1,
wherein the display device is configured to detect a touch motion,
wherein the pixel circuit is electrically connected to a sensor driver circuit, and
wherein the photodetector circuit is configured to output, to the sensor driver circuit, a signal corresponding to the amount of light detected by the light-receiving element.

7. A display module comprising:
the display device according to claim 1; and
a circuit board.

8. An electronic device comprising:
the display module according to claim 7; and
at least one of an antenna, a battery, a housing, a camera, a speaker, a microphone, and an operation button.

9. A display device comprising:
a photodetector circuit; and
a pixel circuit,
wherein the photodetector circuit comprises:
    a light-receiving element;
    a first transistor; and
    a second transistor,
wherein the pixel circuit comprises:
    a liquid crystal element; and
    a third transistor,
wherein one of a source and a drain of the first transistor is electrically connected to a first electrode of the light-receiving element,
wherein the one of the source and the drain of the first transistor is electrically connected to one of a source and a drain of the second transistor,
wherein the other of the source and the drain of the second transistor is electrically connected to one of a source and a drain of the third transistor, and
wherein the one of the source and the drain of the third transistor is electrically connected to a first electrode of the liquid crystal element.

10. The display device according to claim 9,
wherein the photodetector circuit comprises a fourth transistor, and
wherein one of a source and a drain of the fourth transistor is electrically connected to the one of the source and the drain of the first transistor and the other of the source and the drain of the fourth transistor is electrically connected to the first electrode of the light-receiving element.

11. The display device according to claim 9, wherein the second transistor comprises an oxide semiconductor in a channel formation region.

12. The display device according to claim 9,
wherein the display device is configured to detect a touch motion,
wherein the pixel circuit is electrically connected to a sensor driver circuit, and
wherein the photodetector circuit is configured to output, to the sensor driver circuit, a signal corresponding to the amount of light detected by the light-receiving element.

13. A display module comprising:
the display device according to claim 9; and
a circuit board.

14. An electronic device comprising:
the display module according to claim 13; and
at least one of an antenna, a battery, a housing, a camera, a speaker, a microphone, and an operation button.

* * * * *